United States Patent
Matsumiya et al.

(10) Patent No.: US 7,871,753 B2
(45) Date of Patent: Jan. 18, 2011

(54) POSITIVE RESIST COMPOSITION AND METHOD OF FORMING RESIST PATTERN

(75) Inventors: Tasuku Matsumiya, Kawasaki (JP); Takako Hirosaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 121 days.

(21) Appl. No.: 12/090,826

(22) PCT Filed: Nov. 9, 2006

(86) PCT No.: PCT/JP2006/322364
§ 371 (c)(1),
(2), (4) Date: Apr. 18, 2008

(87) PCT Pub. No.: WO2007/055272

PCT Pub. Date: May 18, 2007

(65) Prior Publication Data

US 2009/0162786 A1    Jun. 25, 2009

(30) Foreign Application Priority Data

Nov. 11, 2005    (JP)   ............................. 2005-327226

(51) Int. Cl.
G03F 7/004    (2006.01)

(52) U.S. Cl. .................... 430/270.1; 430/326; 430/905; 430/910

(58) Field of Classification Search .............. 430/270.1, 430/326, 910, 905
See application file for complete search history.

(56) References Cited

U.S. PATENT DOCUMENTS

| | | | |
|---|---|---|---|
| 5,945,517 A | 8/1999 | Nitta et al. | |
| 5,994,025 A | 11/1999 | Iwasa et al. | |
| 6,090,526 A * | 7/2000 | Kumar | 430/285.1 |
| 6,180,313 B1 | 1/2001 | Yukawa et al. | |
| 6,869,748 B2 * | 3/2005 | Takeda et al. | 430/270.1 |
| 7,501,220 B2 * | 3/2009 | Hirayama et al. | 430/270.1 |
| 2002/0177068 A1 * | 11/2002 | Park et al. | 430/270.1 |
| 2004/0023153 A1 * | 2/2004 | Takeda et al. | 430/270.1 |
| 2005/0227174 A1 * | 10/2005 | Hatakeyama et al. | 430/270.1 |
| 2006/0160247 A1 | 7/2006 | Koyama et al. | |

FOREIGN PATENT DOCUMENTS

| | | |
|---|---|---|
| EP | 1262830 A1 | 12/2002 |
| JP | 09-208554 | 8/1997 |
| JP | 10-171121 | 6/1998 |
| JP | 11-030864 | 2/1999 |
| JP | H11-035551 | 2/1999 |
| JP | H11-035552 | 2/1999 |
| JP | H11-035573 | 2/1999 |
| JP | 2000-029219 | 1/2000 |
| JP | 2003-241385 | 8/2003 |
| JP | 2005-234451 | 9/2005 |
| WO | WO 2004-074242 | 9/2004 |
| WO | WO 2005/075446 A1 | 8/2005 |

OTHER PUBLICATIONS

International Search Report in connection with corresponding PCT application No. PCT/JP2006/322364 dated Feb. 6, 2007.

European Search report issued in counterpart European Patent Application No. 06823251.1, dated Sep. 3, 2010.

* cited by examiner

Primary Examiner—John S Chu
(74) Attorney, Agent, or Firm—Knobbe, Martens, Olson & Bear, LLP

(57) ABSTRACT

A positive resist composition of the present invention includes a resin component (A) which displays increased alkali solubility under the action of an acid, and an acid generator component (B) which generates an acid upon exposure, wherein the resin component (A) includes a structural unit (a0) containing a carboxyl group, and at least one structural unit (a1) selected from the group consisting of a structural unit represented by a general formula (a1-2) and a structural unit represented by a general formula (a1-4) shown below:

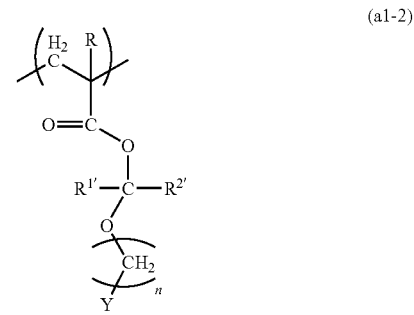

(a1-2)

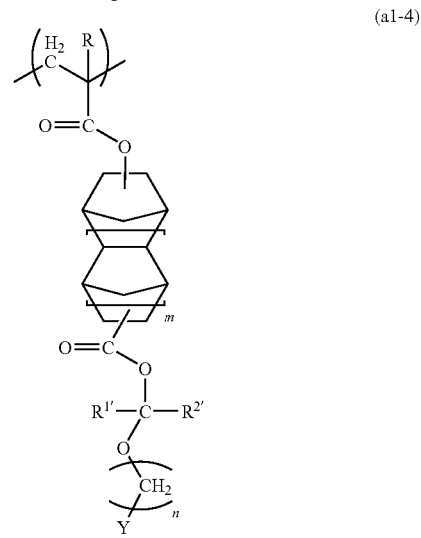

(a1-4)

(in the formula, Y represents an aliphatic cyclic group or a lower alkyl group; n represents an integer from 0 to 3; m represents 0 or 1; R represents a hydrogen atom, a halogen atom, a lower alkyl group, or a halogenated lower alkyl group; and $R^{1'}$ and $R^{2'}$ each independently represents a hydrogen atom or a lower alkyl group of 1 to 5 carbon atoms.).

9 Claims, No Drawings

US 7,871,753 B2

POSITIVE RESIST COMPOSITION AND METHOD OF FORMING RESIST PATTERN

RELATED APPLICATIONS

This application is the U.S. National Phase filing under 35 U.S.C. §371 of PCT/JP2006/322364, filed Nov. 9, 2006, which designated the United States and was published in a language other than English, which claims priority under 35 U.S.C. §119(a)-(d) to Japanese Patent Application No. 2005-327226, filed Nov. 11, 2005. The contents of these applications are incorporated herein by reference in their entireties.

TECHNICAL FIELD

The present invention relates to a positive resist composition and a method of forming a resist pattern.

BACKGROUND ART

Lithography techniques include processes in which, for example, a resist film formed from a resist material is formed on top of a substrate, the resist film is selectively exposed with irradiation such as a light, an electron beam or the like through a mask in which a predetermined pattern has been formed, and then a developing treatment is then conducted, thereby forming a resist pattern of the prescribed shape in the resist film. Resist materials in which the exposed portions change to become soluble in a developing liquid are termed positive materials, whereas resist materials in which the exposed portions change to become insoluble in the developing liquid are termed negative materials.

In recent years, in the production of semiconductor elements and liquid crystal display elements, advances in lithography techniques have lead to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use $F_2$ excimer lasers, electron beams (EB), extreme ultraviolet radiation (EUV) and X-rays.

Resist materials are required to have lithography properties such as sensitivity to the aforementioned light source and resolution enough to reproduce patterns with very fine dimensions. As resist materials which fulfill the aforementioned requirements, there is used a chemically-amplified resist containing a base resin that displays changed alkali solubility under the action of the acid, and an acid generator that generates an acid upon exposure. For example, a chemically-amplified positive resist includes, as a base resin, a resin in which the alkali solubility increases by the action of an acid, and an acid generator, and when an acid is generated from the acid generator upon exposure in the formation of a resist pattern, the exposed portions are converted to an alkali-soluble state.

Until recently, polyhydroxystyrene (PHS) or the resins (PHS-based resins) in which the hydroxyl groups have been protected with acid dissociable, dissolution inhibiting groups, which exhibit a high degree of transparency relative to a KrF excimer laser (248 nm), and a resin (acrylate-based resin) containing a structural unit derived from a (meth)acrylate ester in which a portion of the carboxyl groups are substituted with acid dissociable, dissolution inhibiting groups, which exhibit a high degree of transparency relative to an ArF excimer laser (193 nm), have been used as the base resin of chemically-amplified resists (for example, see Patent Reference 1).

(Patent Reference 1)

Japanese Unexamined Patent Application, First Publication No. 2003-241385.

DISCLOSURE OF THE INVENTION

Problems to be Solved by the Invention

In a resist pattern formation using a positive resist composition, when the relationship between exposure amount and film thickness of a resist film after development following exposure (resist film thickness) is checked by plotting the exposure amount as the abscissa axis and the resist film thickness as the longitudinal axis, the relationship is represented as follows. At first, as the exposure amount increases, the solubility of the exposed portion in the resist composition increases relative to an alkali developing solution. Accompanied with the increase in the solubility, the exposed portion is dissolved in the alkali developing solution, and thus the resist film thickness as the longitudinal axis decreases. Subsequently, when the exposure amount reaches a certain amount, the exposed portion is completely dissolved in the alkali developing solution, and thus the resist film thickness becomes 0.

When the exposure amount further increases and exceeds another certain amount, the solubility of the exposed portion in the resist composition relative to the alkali developing solution, opposite to the above, decreases. As a result, the exposed portion remains in a state that it is not completely dissolved in the alkali developing solution, that is, so-called "negative conversion" starts to be caused. The "negative conversion" causes such problems that the difference in alkali solubility (dissolution contrast) between the exposed portion and the unexposed portion becomes decreased, and thus the resolution is insufficient. Therefore, there is desired a positive resist composition having a wide range of exposure amount between the exposure amount in which the above resist film thickness becomes 0 and the exposure amount in which the so-called "negative conversion" starts to be caused. Hereinafter, the range of the exposure amount between them is sometimes referred to as "negative conversion margin".

The present invention takes the above circumstances into consideration, with an object of providing a positive resist composition and a method of forming a resist pattern which enable an excellent negative conversion margin to be obtained.

Means for Solving the Problems

The inventors of the present invention suggest the following in order to improve the above problem.

A first aspect of the present invention is a positive resist composition, which includes a resin component (A) in which alkali solubility increases under the action of an acid; and an acid generator component (B) which generates an acid upon exposure, wherein the component (A) includes a structural unit (a0) having a carboxyl group, and at least one structural unit (a1) selected from the groups consisting of a structural unit represented by a general formula (a1-2) shown below and a structural unit represented by a general formula (a1-4) shown below.

[Formula 1]

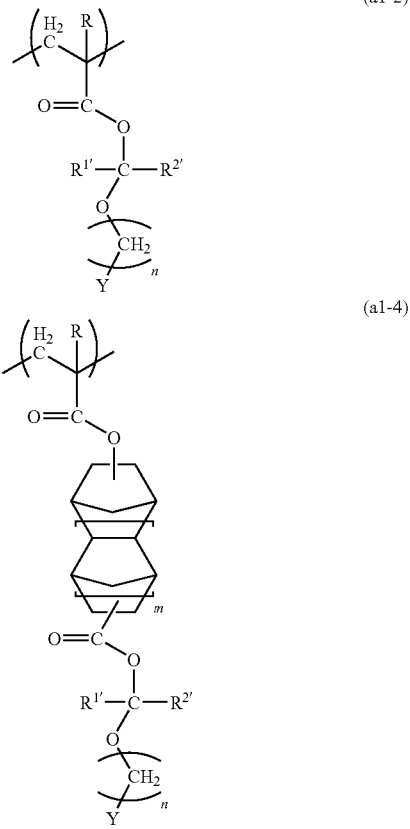

(wherein, Y represents an aliphatic cyclic group or a lower alkyl group; n represents an integer from 0 to 3; m represents an integer of 0 or 1; R represents a hydrogen atom, a halogen atom, a lower alkyl group, or a halogenated lower alkyl group; and $R^{1'}$ and $R^{2'}$ each independently represents a hydrogen atom or a lower alkyl group of 1 to 5 carbon atoms.)

A second aspect of the present invention represents a resist pattern-forming method, which includes forming a resist film on a substrate using the positive resist composition described in the first aspect, exposing the resist film, and developing the resist film to form a resist pattern.

Here, in the present specification and claims, the term "exposure" is used as a general concept containing irradiation with any form of radiation.

Effects of the Invention

According to the present invention, there can be provided a positive resist composition and a method of forming a resist pattern which enable an excellent negative conversion margin to be obtained.

BEST MODE FOR CARRYING OUT THE INVENTION

Positive Resist Composition

The positive resist composition of the present invention includes a resin component (A) (hereinafter, referred to as component (A)) in which alkali solubility increases under the action of an acid, and an acid generator component (B) (hereinafter, referred to as component (B)) which generates an acid upon exposure.

In the positive resist composition of the present invention, the component (A) is alkali-insoluble before exposure. When the acid generated from the component (B) upon exposure acts on the component (A), the acid dissociable, dissolution inhibiting groups are dissociated, and the alkali solubility of the entire component (A) is enhanced. As a result, the positive resist composition changes from an alkali-insoluble state to an alkali-soluble state. Therefore, in the formation of a resist pattern, when a resist film obtained by using the positive resist composition is subjected to selective exposure, the exposed area becomes soluble in an alkali, while the unexposed area remains alkali-insoluble, and hence a resist pattern can be formed by developing with an alkali.

Component (A)

In the present invention, the component (A) includes a polymer compound (A1) which contains a structural unit (a0) having a carboxyl group, and at least one of a structural unit (a1) selected from the group consisting of a structural unit represented by a general formula (a1-2) and a structural unit represented by a general formula (a1-4).

Hereinafter, as the component (A) preferably used in the present invention, the structural units (a0) and (a1), which are indispensable structural units of the component (A), will be firstly explained) and then the component (A) suitably used in lithography using an electron beam (EB) or a KrF excimer laser and in lithography using an ArF excimer laser will be explained with examples in each case.

Structural Unit (a0)

The structural unit (a0) is a structural unit containing a carboxyl group. In the present invention, the component (A) includes a polymer compound (A1) which contains the structural unit (a0) and a structural unit (a1) described below, thereby obtaining an excellent negative conversion margin.

Examples of the structural unit containing a carboxyl group include a structural unit formed by cleavage of the ethylenic double bond of an acrylate ester. Of these, a structural unit formed by cleavage of the ethylenic double bond of an acrylic acid or an acrylate ester is preferable.

Here, in the present specification, the term "acrylic acid or acrylate ester" is a concept containing not only an acrylic acid or an acrylate ester in which a hydrogen atom is bonded with the carbon atom at the α-position, but also those in which a substituent group (an atom or a group other than a hydrogen atom) is bonded with the carbon atom at the α-position.

Examples of the substituent group include a halogen atom, a lower alkyl group, and a halogenated lower alkyl group. Examples of the halogen atoms include a fluorine atom, a chlorine atom, a bromine atom and an iodine atom. Of these, a fluorine atom is preferable.

The term "α-position (carbon atom at the α-position)" in a structural unit derived from an acrylic acid or an acrylate ester represents a carbon atom with which a carbonyl group is bonded, if not otherwise specified.

The term "alkyl group" is a concept containing a linear, branched and cyclic monovalent saturated hydrocarbon group, unless another definition is particularly provided.

The term "lower alkyl group" represents an alkyl group of 1 to 5 carbon atoms.

In the acrylic acid or the acrylate ester, specific examples of the lower alkyl group in the substituent group at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

The term "halogenated lower alkyl group" represents a group in which a part of or all of hydrogen atoms in the lower alkyl group is/are substituted with halogen atoms, and suitable examples of the halogen atoms include a fluorine atom, a chlorine atom, a bromine atom, or an iodine atom. Of these, a fluorine atom is preferable.

In the present invention, the atom or group which is bonded with the carbon atom at the α-position of an acrylic acid or an acrylate ester is preferably a hydrogen atom, a halogen atom, a lower alkyl group, or a halogenated lower alkyl group, more preferably a hydrogen atom, a fluorine atom, a lower alkyl group, or a fluorinated alkyl group, and most preferably a hydrogen atom or a methyl group in terms of industrial availability.

Here, in the present specification, the term "(meth)acrylic acid" represents an acrylic acid and/or a methacrylic acid. Also, the term "(meth)acrylate ester" represents an acrylate ester in which a hydrogen atom is bonded with the carbon atom at the α-position, and/or a methacrylate ester in which a methyl group is bonded with the carbon atom at the α-position.

There is no particular restriction on the bonding position of the carboxyl group in the structural unit (a0). The carboxyl group may be directly bonded with the main chain of the structural unit, or may be bonded with the side chain thereof.

Of these, the structural unit (a0) preferably includes a structural unit represented by general formulae (a0-1) and/or (a0-2) shown below.

[Formula 2]

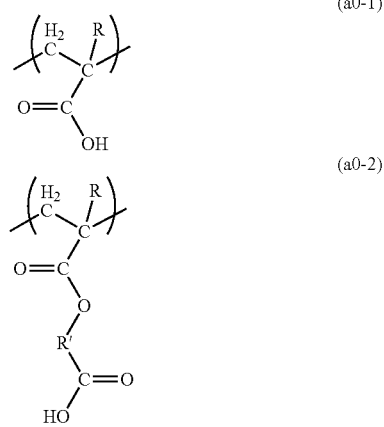

(wherein, R represents a hydrogen atom, a halogen atom, a lower alkyl group, or a halogenated lower alkyl group; and R' represents a chain or cyclic alkylene group.)

In the formulae, the halogen atom, the lower alkyl group or the halogenated lower alkyl group of R is the same as the halogen atom, the lower alkyl group or the halogenated alkyl group which may be bonded with the carbon atom at the α-position of the acrylic acid or the acrylate ester described above. R is most preferably a methyl group.

In the general formula (a0-2), R' represents a chain or cyclic alkylene group.

The chain alkylene group may be linear or branched. The number of carbon atoms in the chain alkylene group is preferably from 1 to 5, and more preferably from 1 to 3. Specific examples thereof include a methylene group, an ethylene group, and a propylene group.

The number of carbon atoms in the cyclic alkylene group is preferably from 4 to 12, more preferably from 5 to 10, and most preferably from 6 to 10. Examples thereof include groups in which two hydrogen atoms have been removed from a monocycloalkane, or a polycycloalkane such as a bicycloalkane, tricycloalkane, and tetracycloalkane. Specific examples thereof include groups in which two hydrogen atoms have been removed from a monocycloalkane such as cyclopentane and cyclohexane, and a polycycloalkane such as adamantane, norbornane, isobornane, tricyclodecane, and tetracyclododecane.

Here, the cyclic alkylene group may contain a substituent group, or no substituent group. Examples of the substituent group include a lower alkyl group of 1 to 5 carbon atoms.

R' is preferably a group in which two hydrogen atoms have been removed from norbornane or tetracyclododecane.

Of these, the structural unit (a0) is preferably a structural unit represented by the general formula (a0-1) shown above, more preferably an acrylic acid in which R is a hydrogen atom, or a methacrylic acid in which R is a methyl group, and most preferably a methacrylic acid, in terms of the effect of the present invention.

In the polymer compound (A1), the structural unit (a0) can be used alone, or in combination of two or more different units.

The proportion of the structural unit (a0) in the polymer compound (A1) is preferably 1 to 20 mol %, more preferably 1 to 10 mol %, and still more preferably 1 to 8 mol %, and most preferably 1 to 5 mol %, relative to the combined total of all the structural units that constitute the polymer compound (A1) When this proportion is not less than the lower limit in the above range, then the effect by containing the structural unit (a0) can be sufficiently obtained, whereas when the proportion is not more than the upper limit in the above range, good quantitative balance with the other components can be attained.

Structural Unit (a1)

The structural unit (a1) is at least one structural unit selected from the group consisting of the structural unit represented by the general formula (a1-2) and the structural unit represented by the general formula (a1-4). In the present invention, the component (A) includes a polymer compound (A1) which contains the structural unit (a0) described above and the structural unit (a1), thereby obtaining an excellent negative conversion margin.

The structural unit (a1) is a structural unit derived from an acrylate ester, and includes a structure in which an acetal group (alkoxyalkyl group) type of an acid dissociable, dissolution inhibiting group (—C($R^{1\prime}R^{2\prime}$)—O—$(CH_2)_n$—Y) is bonded with an oxygen atom at the terminal of a carbonyloxy group (—C(O)—O—) derived from a carboxyl group.

Here, the term "structural unit derived from an acrylate ester" in the present specification represents a structural unit formed by cleavage of the ethylenic double bond of an acrylate ester.

In the structural unit (a1), the bond of the acid dissociable, dissolution inhibiting group with the oxygen atom at the terminal of the carbonyloxy group is cleaved by the action of an acid. Therefore, the polymer compound (A1) of the present invention is alkali-insoluble prior to the action of an acid. By the action of an acid, the acid dissociable, dissolution inhibiting group is dissociated, thereby changing the entire polymer component (A1) from an alkali-insoluble state to an alkali-soluble state.

Further, since the elimination energy of the acetal group (alkoxyalkyl group) type acid-dissociable, dissolution inhibiting group is lower than that of the tertiary ester type acid-dissociable, dissolution inhibiting group, the polymer compound (A1) containing the structural unit (a1) has the effects that, even if the strength of an acid is weak, the acid dissociable, dissolution inhibiting group can be dissociated, thereby increasing the alkali solubility and achieving a fine pattern. Moreover, since the elimination energy is low, the strength of an acid as a catalyst can be weakened, thereby obtaining such an advantage that the kind of acid generators to be selected can be increased. Specifically, an acid dissociable, dissolution inhibiting group can be dissociated even by using acid generators such as diazomethane-based acid generators, acid generators having a camphorsulfonate ion as the anion, and oxime sulfonate-based acid generators.

In the general formulae (a1-2) and (a1-4), R represents a hydrogen atom, a halogen atom, a lower alkyl group, or a halogenated lower alkyl group. R of the general formulae (a1-2) and (a1-4) is the same as R described above in the general formulae (a0-1) and (a0-2). Of these, a methyl group is most preferable.

$R^{1'}$ and $R^{2'}$ each independently represents a hydrogen atom or a lower alkyl group of 1 to 5 carbon atoms. In the present invention, at least one of $R^{1'}$ and $R^{2'}$ is preferably a hydrogen atom, and it is more preferable that both of $R^{1'}$ and $R^{2'}$ are hydrogen atoms, because the effect of the present invention is excellent.

n represents an integer from 0 to 3, preferably from 0 to 2, more preferably 0 or 1, and most preferably 0.

m represents 0 or 1, and preferably 1.

Y represents an aliphatic cyclic group (alicyclic group) or a lower alkyl group.

The lower alkyl group of Y represents the same as the lower alkyl group described above in R.

The aliphatic cyclic group of Y is preferably an aliphatic cyclic group of 20 or less carbon atoms, and more preferably an aliphatic cyclic group of 5 to 12 carbon atoms.

Here, the aliphatic cyclic group may be saturated or unsaturated, and it is preferable to be saturated under normal conditions.

Y may contain a substituent group or no substituent group. Examples of the substituent group include a lower alkyl group of 1 to 5 carbon atoms, a fluorine atom, a fluorinated lower alkyl group of 1 to 5 carbon atoms in which hydrogen atoms are substituted with fluorine atoms, and a hydrophilic group. Examples of the hydrophilic group include "=O", "—COOR" (herein, R represents an alkyl group), an alcoholic hydroxyl group, "—OR" (herein, R represents an alkyl group), an imino group, and an amino group. Of these, "=O" or an alcoholic hydroxyl group is preferable in terms of ease of availability.

The structure of a basic ring in which substituent groups have been removed in the aliphatic cyclic group may be either a ring composed of carbon atoms and hydrogen atoms (hydrocarbon ring), or a heterocyclic ring in which a portion of the carbon atoms that constitute the hydrocarbon ring are substituted with hetero atoms such as sulfur atoms, oxygen atoms, and nitrogen atoms. The basic ring of Y is preferably a hydrocarbon ring in terms of the effect of the present invention.

The hydrocarbon ring can be appropriately selected from the multitude of groups proposed in electron beam (EB) resists, KrF resists, ArF resists or the like, and specific examples thereof include monocycloalkanes and polycycloalkanes such as bicycloalkanes, tricycloalkanes, and tetracycloalkanes. Specific examples of monocycloalkanes include cyclopentane and cyclohexane. Also, examples of polycycloalkanes include adamantane, norbornane, norbornene, methylnorbornane, ethylnorbornane, methylnorbornene, ethylnorbornene, isobornane, tricyclodecane, and tetracyclododecane. Of these, cyclohexane, cyclopentane, adamantane, norbornane, norbornene, methylnorbornane, ethylnorbornane, methylnorbornene, ethylnorbornene, and tetracyclododecane are industrially preferable. Of these, adamantane is most preferable.

Specific examples of structural units represented by general formulae (a1-2) and (a1-4) shown above include the following.

[Formula 3]

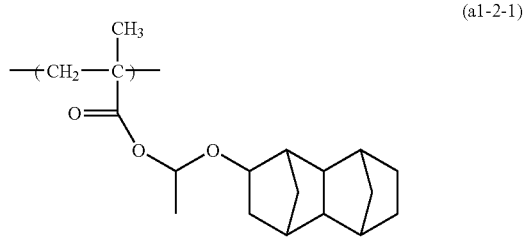

(a1-2-1)

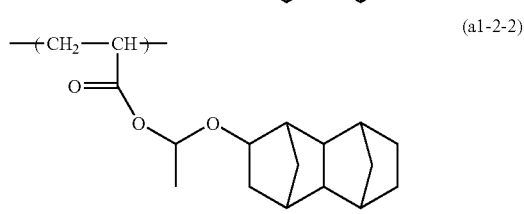

(a1-2-2)

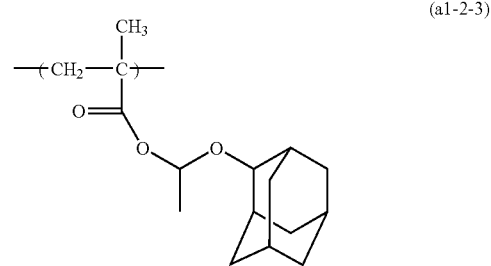

(a1-2-3)

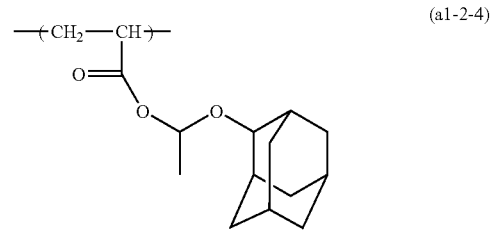

(a1-2-4)

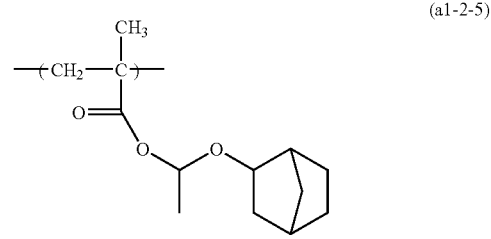

(a1-2-5)

-continued
(a1-2-6)
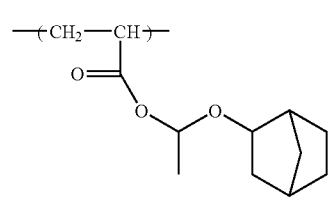
[Formula 4]
(a1-2-7)
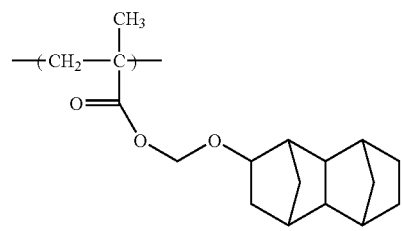
(a1-2-8)
(a1-2-9)
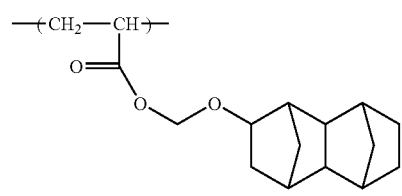
(a1-2-10)
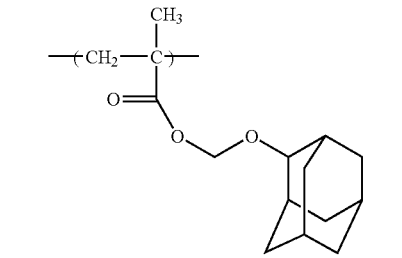
(a1-2-11)
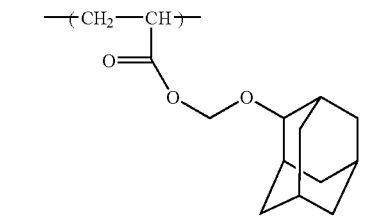
(a1-2-12)
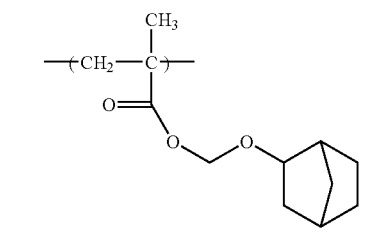
-continued
(a1-2-13)
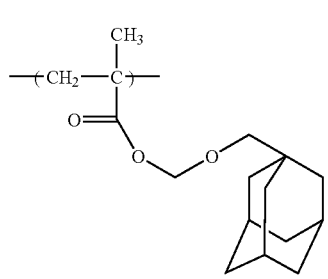
(a1-2-14)
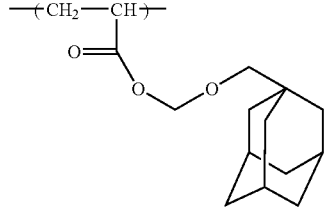
(a1-2-15)
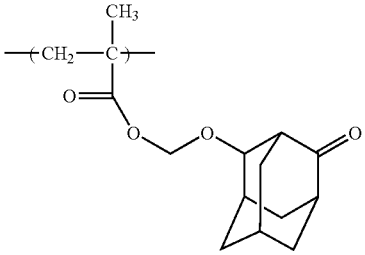
(a1-2-16)
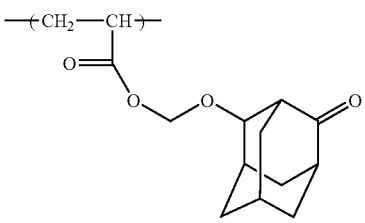
(a1-2-17)
(a1-2-18)
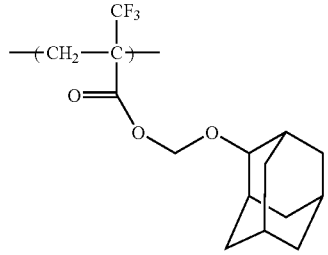

-continued
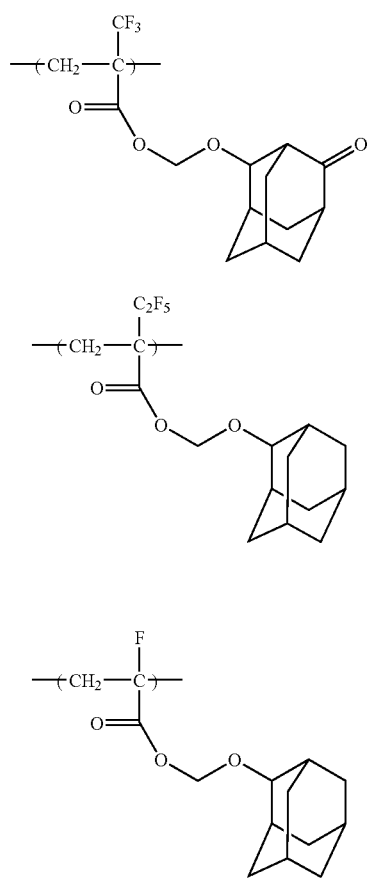
(a1-2-19)
(a1-2-20)
(a1-2-21)
[Formula 5]
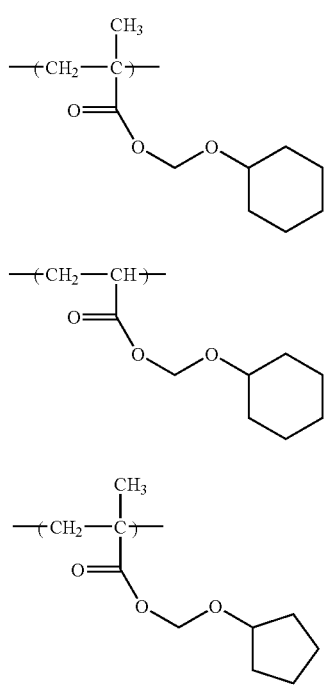
(a1-2-22)
(a1-2-23)
(a1-2-24)
-continued
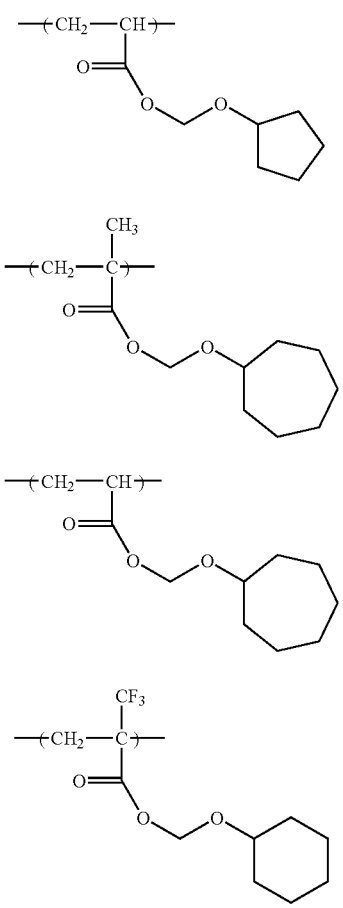
(a1-2-25)
(a1-2-26)
(a1-2-27)
(a1-2-28)
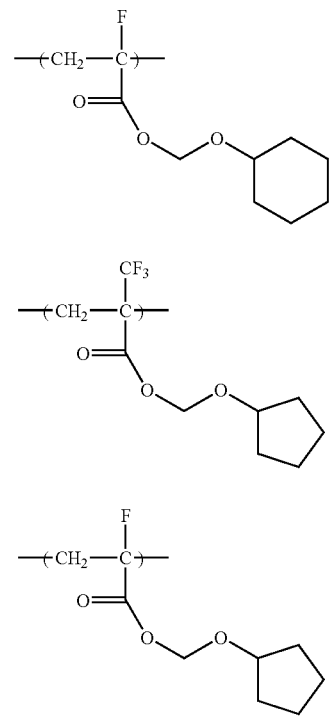
(a1-2-29)
(a1-2-30)
(a1-2-31)

(a1-2-32)
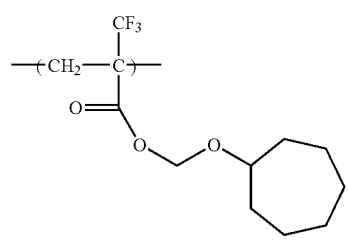
(a1-2-33)
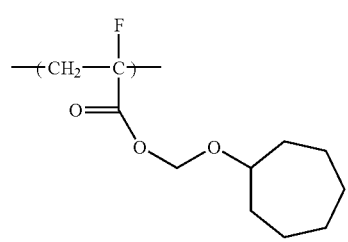
(a1-2-34)
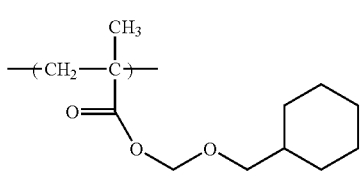
(a1-2-35)
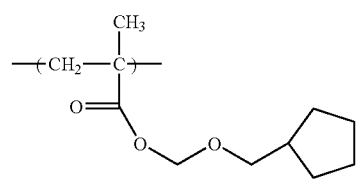
[Formula 6]
(a1-4-1)
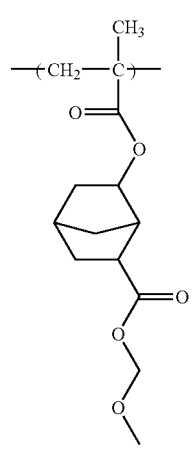
(a1-4-2)
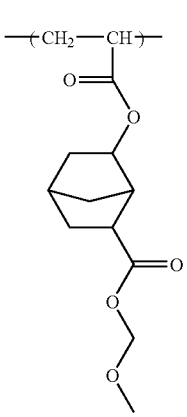
(a1-4-3)
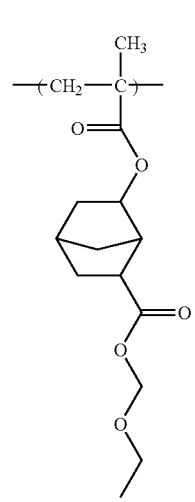
(a1-4-4)
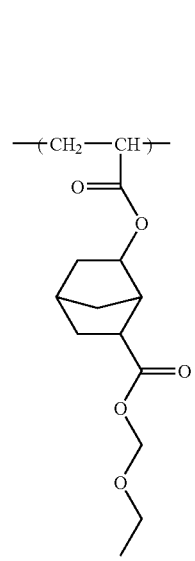

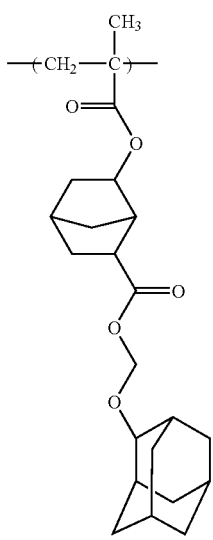 (a1-4-5)
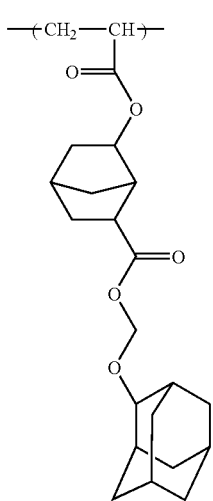 (a1-4-6)
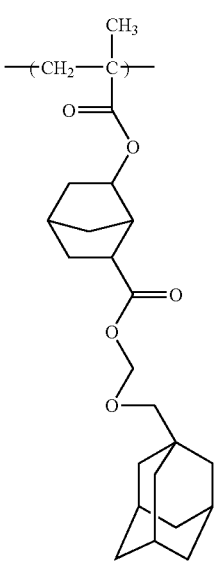 (a1-4-7)
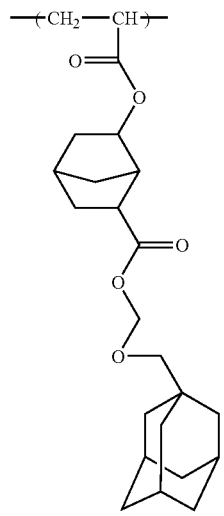 (a1-4-8)
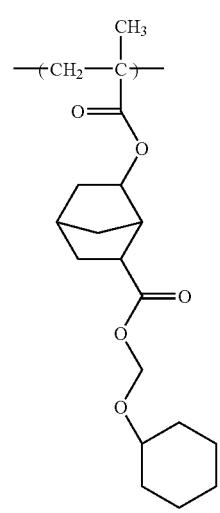 (a1-4-9)
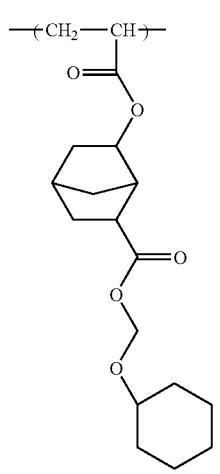 (a1-4-10)

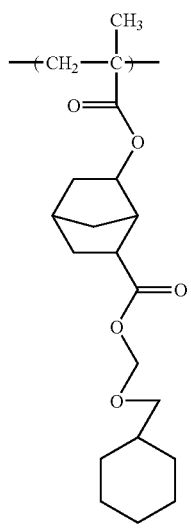
(a1-4-11)
(a1-4-12)
(a1-4-13)
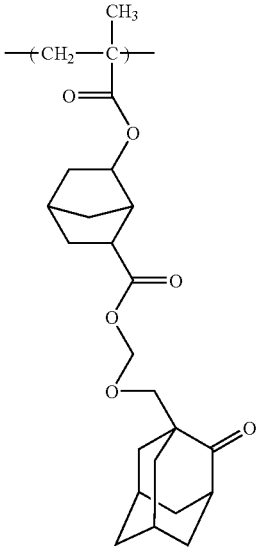
(a1-4-14)
(a1-4-15)
[Formula 7]
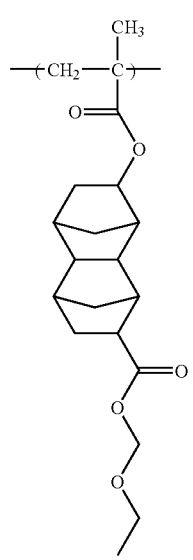
(a1-4-16)
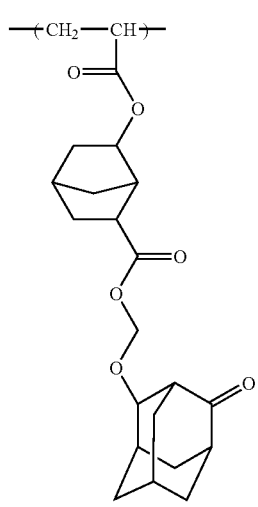

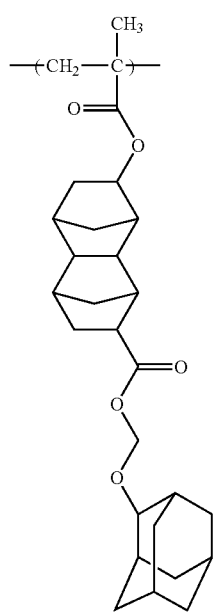
(a1-4-17)
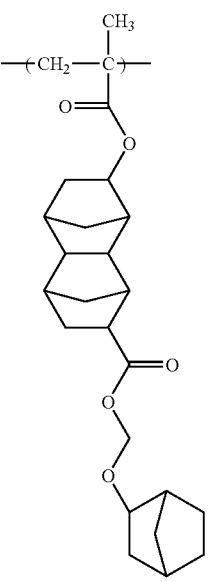
(a1-4-19)
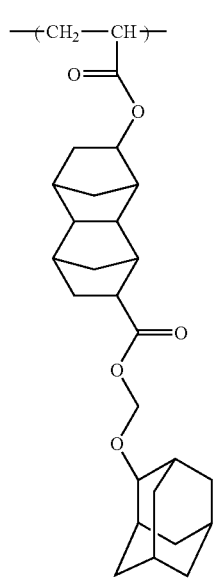
(a1-4-18)
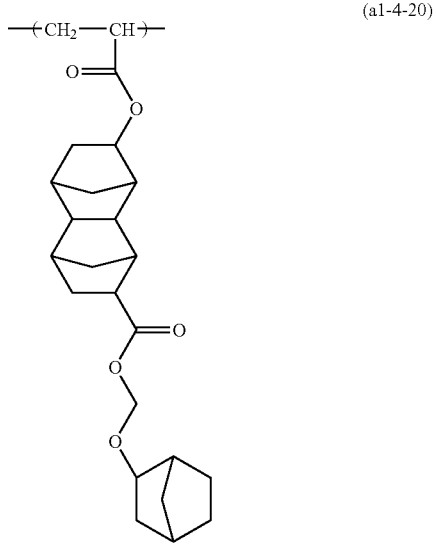
(a1-4-20)

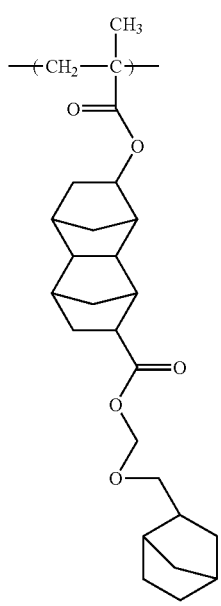
(a1-4-21)
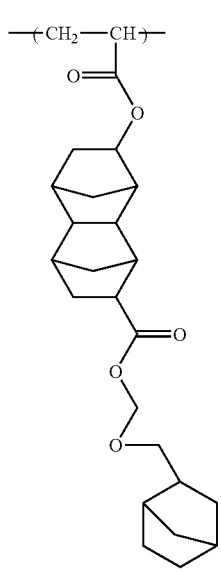
(a1-4-22)
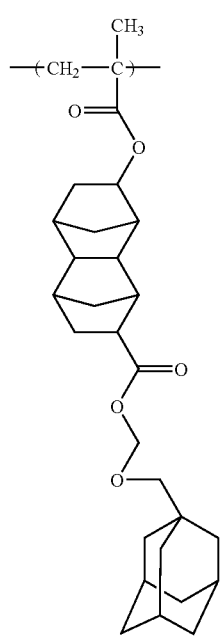
(a1-4-23)
(a1-4-24)

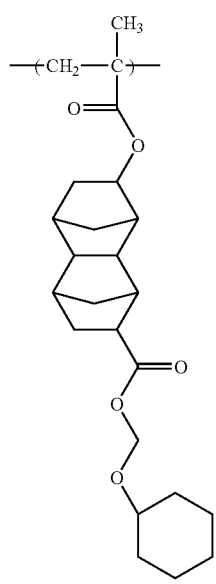
(a1-4-25)
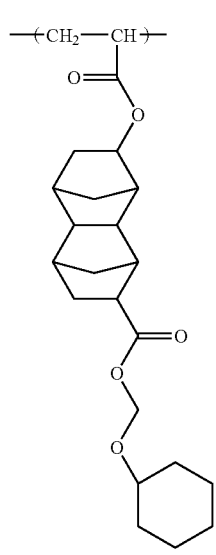
(a1-4-26)
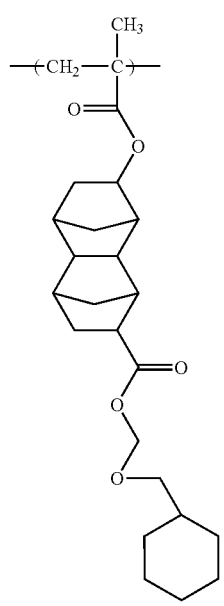
(a1-4-27)
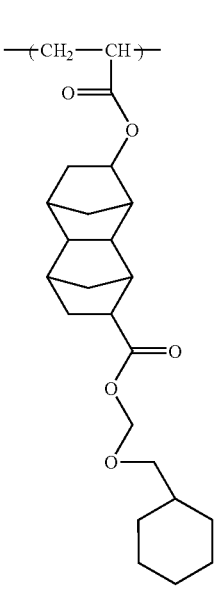
(a1-4-28)

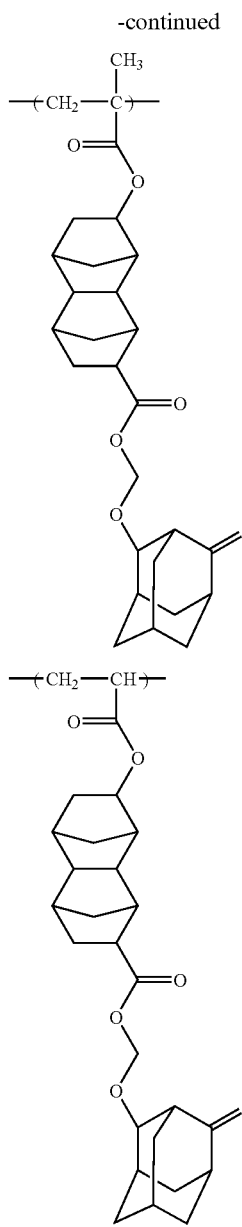

(a1-4-29)

(a1-4-30)

In the present invention, the structural unit (a1) particularly preferably includes a structural unit represented by the general formula (a1-2) shown above, because the effect of the present invention is excellent. Of these, a structural unit represented by a general formula (a1-2-9), (a1-2-10), (a1-2-13), (a1-2-14), (a1-2-15), or (a1-2-16) is more preferable, and a structural unit represented by the general formula (a1-2-9) is most preferable.

In the polymer compound (A1), the structural unit (a1) can be used alone, or in combination of two or more different units.

In the polymer compound (A1), the proportion of the structural unit (a1) is preferably 5 to 50 mol %, more preferably 10 to 40 mol %, still more preferably 15 to 35 mol %, and most preferably 15 to 25 mol %, relative to the combined total of all the structural units that constitute the polymer compound (A1). When this proportion is not less than the lower limit in the above range, a pattern can be obtained in the case of using a resist composition containing the structural unit (a1), whereas when the proportion is not more than the upper limit in the above range, good quantitative balance with the other components can be attained. Also, when the proportion is within the above range, the effect of the present invention can be improved.

The weight average molecular weight (Mw) (the polystyrene equivalent value determined by gel permeation chromatography (GPC), hereinafter defined as the same) of the polymer compound (A1) is preferably from 3,000 to 50,000, more preferably from 5,000 to 30,000, and still more preferably from 5,000 to 20,000. When the weight average molecular weight of the polymer compound (A1) is 50,000 or less, solubility to a resist solvent can be provided sufficiently, and roughness can be suppressed. Also, when the weight average molecular weight of the polymer compound (A1) is 3,000 or more, solubility to a developing solution can be easily controlled. Furthermore, it has the effect of increasing dry-etching resistance and improving thickness loss.

Less dispersion degree (Mw/Mn) of the polymer compound (A1) (that is, dispersion degree closer to monodispersity) is preferable, because it excels in resolution. Here, Mn represents the number average molecular weight. The dispersion degree of the polymer compound (A1) is preferably within a range from 1.0 to 5.0, more preferably from 1.0 to 3.0, and most preferably from 1.1 to 2.5.

Next, the component (A) suitably used for lithography using an electron beam (EB) or a KrF excimer laser will be described below.

The component (A) suitably used for an electron beam (EB) or a KrF excimer laser preferably includes a polymer compound (A1)'. The polymer compound (A1)' includes the structural units (a0) and (a1) described above as indispensable components, and preferably further contains, for example, at least one of a structural unit (a2)' derived from hydroxystyrene (hereinafter referred to as structural unit (a2)') and a structural unit (a3)' derived from styrene (hereinafter, referred to as structural unit (a3)'). The polymer compound (A1)' may further contain another structural unit (a4)'. The structural units (a2)', (a3)' and (a4)' will be explained below.

Structural Unit (a2)'

It is preferable that the polymer compound (A1)' contains a structural unit (a2)' derived from a hydroxystyrene.

Here, the term "hydroxystyrene" is a concept containing a hydroxystyrene; those in which a hydrogen atom bonded with the α-position of a hydroxystyrene is substituted with a substituent group such as a halogen atom, an alkyl group, a halogenated alkyl group or the like; and a derivative thereof, namely a hydroxystyrene derivative (monomer). Examples of halogen atoms include a chlorine atom, a fluorine atom, and a bromine atom. Of these, a fluorine atom is preferable. The term "alkyl group" is a concept containing linear, branched, and cyclic monovalent saturated hydrocarbon groups. The halogenated alkyl group is a group in which a part of or all of hydrogen atoms of the alkyl group is/are substituted with halogen atoms, and the halogen atoms here represent the same as those described above.

The term "structural unit derived from hydroxystyrene" is a concept containing a structural unit formed by the cleavage of the ethylenic double bond of a hydroxystyrene and a hydroxystyrene derivative (monomer).

The term "hydroxystyrene derivatives" is a concept containing those containing at least one benzene ring and a hydroxyl group bonded with the benzene ring, such as those in which a hydrogen atom bonded with the α-position of a hydroxystyrene is substituted with a halogen atom, a lower alkyl group of 1 to 5 carbon atoms, a halogenated alkyl group or the like; those in which a lower alkyl group of 1 to 5 carbon atoms is further bonded with the benzene ring with which a hydroxyl group of a hydroxystyrene is bonded; and one or two hydroxyl groups are further bonded with the benzene ring with which a hydroxyl group of the hydroxystyrene has already bonded (in this case, the total number of hydroxyl groups is 2 or 3).

The halogen atom here represents the same as those described above.

The term "α-position of a hydroxystyrene" represents a carbon atom with which a benzene ring is bonded, if not otherwise specified.

Suitable examples of the structural unit (a2)' in the present invention include a structural unit represented by a general formula (a-2)' shown below.

[Formula 8]

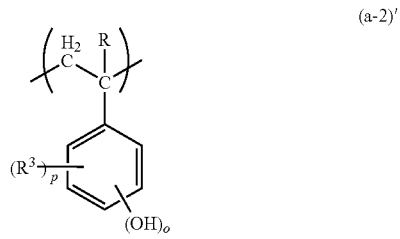

(in the general formula (a-2)' shown above, R represents a hydrogen atom, an alkyl group, a halogen atom, or a halogenated alkyl group; $R^3$ represents a lower alkyl group of 1 to 5 carbon atoms; o represents an integer from 0 to 3; and p represents an integer from 0 to 2.)

The alkyl group of R in the general formula (a-2)' is preferably a lower alkyl group of 1 to 5 carbon atoms. Also, it is preferably a linear or branched alkyl group, and examples thereof include a methyl group, an ethyl group, a propyl group, an isopropyl group, an n-butyl group, an isobutyl group, a tert-butyl group, a pentyl group, an isopentyl group, and neopentyl group. Of these, a methyl group is industrially preferable.

Examples of the halogen atoms include a fluorine atom, a chlorine atom, a bromine atom and an iodine atom. Of these, a fluorine atom is preferable.

The halogenated alkyl group is a group in which a part of or all of hydrogen atoms in the alkyl group is/are substituted with halogen atoms. The halogenated alkyl group is preferably a halogenated lower alkyl group in which a part of or all of hydrogen atoms in the alkyl group of 1 to 5 carbon atoms is/are substituted with halogen atoms. Here, the halogen atoms represent the same as the halogen atoms described above in R. Of these, all of the hydrogen atoms are preferably fluorinated.

The halogenated lower alkyl group is preferably a linear or branched fluorinated lower alkyl group, more preferably a trifluoromethyl group, a hexafluoroethyl group, a heptafluoropropyl group, or a nonafluorobutyl group, and most preferably a trifluoromethyl group ($-CF_3$).

R is preferably a hydrogen atom or a methyl group, and more preferably a hydrogen atom.

The lower alkyl group of 1 to 5 carbon atoms of $R^3$ represents the same as the lower alkyl group of 1 to 5 carbon atoms of R described above.

o represents an integer from 1 to 3, and is preferably 1. In the case that o is 1, the position of the hydroxyl group may be ortho-position, meta-position or para-position, and para-position is preferable because of ease of availability and inexpensiveness. Further, in the case that o is 2 or 3, substitution positions can be arbitrarily combined.

p represents an integer from 0 to 2. Of these, p is preferably 0 or 1, and industrially it is more preferable that p is 0. Here, in the case that p is 1, the substitution position of $R^3$ is either ortho-position, meta-position or para-position. Furthermore, in the case of that p is 2, substitution positions can be arbitrarily combined.

In the polymer compound (A1)', the structural unit (a2)' can be used alone, or in combination of two or more different units.

In the polymer compound (A1)', the proportion of the structural unit (a2)' is preferably 10 to 80 mol %, more preferably 20 to 75 mol %, still more preferably 40 to 70 mol %, and most preferably 50 to 70 mol %, relative to the combined total of all the structural units that constitute the polymer compound (A1)'. Ensuring that the proportion of the structural unit (a2)' is within the range, appropriate alkali solubility can be obtained, and good quantitative balance with the other structural units can be attained.

Structural Unit (a3)'

It is preferable that the polymer compound (A1)' contains a structural unit (a3)' derived from a styrene.

Here, the term "structural unit derived from a styrene" is a concept containing a structural unit formed by cleavage of the ethylenic double bond of a styrene and a styrene derivative (here, hydroxystyrene is not included in the styrene derivative).

The term "styrene derivative" is a concept containing those in which a hydrogen atom bonded with the α-position of styrene is substituted with another substituent group such as a halogen atom, an alkyl group, a halogenated alkyl group, or the like; and those in which a hydrogen atom of a phenyl group in a styrene is substituted with a substituent group such as a lower alkyl group of 1 to 5 carbon atoms.

Examples of halogen atoms include a chlorine atom, a fluorine atom, and a bromine atom. Of these, a fluorine atom is preferable. The alkyl group represents the same as the alkyl group of R described above in the general formula (a-2)'. The halogenated alkyl group represents the same as the halogenated alkyl group of R described above in the general formula (a-2)'.

Here, the term "α-position of hydroxystyrene" represents a carbon atom with which a benzene ring is bonded, if not otherwise specified.

Suitable examples of the structural unit (a3)' in the present invention include a structural unit represented by a general formula (a-3)' shown below.

[Formula 9]

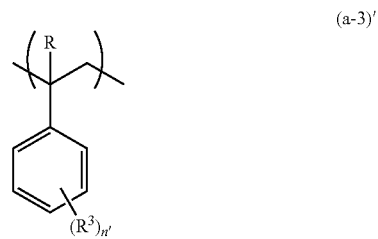

(in the general formula (a-3)' shown above, R represents a hydrogen atom, an alkyl group, a halogen atom, or a halogenated alkyl group; $R^3$ represents a lower alkyl group of 1 to 5 carbon atoms; and n' represents an integer from 0 to 3.)

In the general formula (a-3)', R and $R^3$ represent the same as R and $R^3$ described above in the general formula (a-2)'.

n' represents an integer from 0 to 3. Of these, n' is preferably 0 or 1, and industrially it is more preferable that n' is 0. In the case that n' is 1 to 3, the substitution position of $R^3$ may be ortho-position, meta-position or para-position. Further, in the case that n' is 2 or 3, substitution positions can be arbitrarily combined.

In the polymer compound (A1)', the structural unit (a3)' can be used alone, or in combination of two or more different units.

In the polymer compound (A1)', the proportion of the structural unit (a3)' is preferably 1 to 20 mol %, more preferably 3 to 15 mol %, and still more preferably 5 to 15 mol %, relative to the combined total of all the structural units that constitute the polymer compound (A1)'. Ensuring that the proportion of the structural unit (a3)' is within the range, the effect obtained by containing the structural unit (a3)' is excellent, and good quantitative balance with the other structural units can be attained.

Structural Unit (a-4)'

The polymer compound (A1)' may also include a structural unit (a-4)' other than the structural units (a0), (a1), (a2)' and (a3)' within the range that the effect of the present invention is not impaired.

As the structural unit (a-4)', any structural unit can be used without particular restrictions, as long as the structural unit is not classified as one of the above structural units (a0), (a1), (a2)' and (a3)', and any of the multitude of conventional structural units used within resist resins for ArF excimer lasers, electron beams (EB) or KrF excimer lasers can be used.

In the case that the structural unit (a-4)' is included in the polymer compound (A1)', the proportion of the structural unit (a-4)' is preferably 1 to 10 mol %, relative to the combined total of all the structural units that constitute the polymer compound (A1)'.

In the present invention, the polymer compound (A1)' is a copolymer containing structural units (a0) and (a1), and it is preferable that the polymer compound (A1)' is a copolymer further containing a structural unit (a2)' and/or (a3)'. Examples of the copolymer include a copolymer composed of the structural units (a0), (a1), (a2)' and (a3)'; and a copolymer composed of the structural units (a0), (a1), (a2)', (a3)' and (a-4)'. Of these, a copolymer composed of the structural units (a0), (a1), (a2)' and (a3)' is most preferable.

As a copolymer used in the present invention, a copolymer containing a combination of structural units such as a general formula (A1-1) shown below is preferable.

[Formula 10]

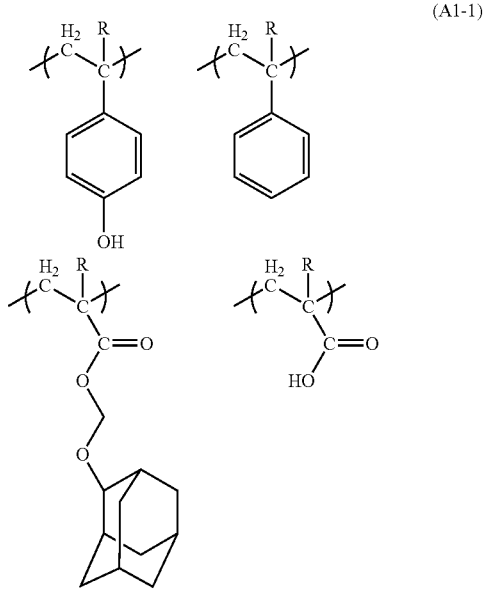

(in the formula, R represents a hydrogen atom, an alkyl group, a halogen atom, or a halogenated alkyl group.)

The polymer compound (A1)' can be obtained, for example, by a conventional radical polymerization or the like of the monomers corresponding with each of the structural units, using a radical polymerization initiator such as azobisisobutyronitrile (AIBN).

The weight average molecular weight (Mw) (the polystyrene equivalent value determined by gel permeation chromatography (GPC), hereinafter defined as the same) of the polymer compound (A1)' is preferably from 3,000 to 50,000, more preferably from 5,000 to 30,000, and still more preferably from 5,000 to 20,000. When the weight average molecular weight of the polymer compound (A1)' is 50,000 or less, solubility to a resist solvent can be provided sufficiently, and roughness can be suppressed. Also, when the weight average molecular weight of the polymer compound (A1)' is 3,000 or more, solubility to a developing solution can be easily controlled. Moreover, dry-etching resistance can be increased, and film thickness can be also improved.

Less dispersion degree (Mw/Mn) of the polymer compound (A1)' (that is, dispersion degree closer to monodispersity) is preferable, because it excels in resolution. Here, Mn represents the number average molecular weight. The dispersion degree of the polymer compound (A1)' is preferably within a range from 1.0 to 5.0, more preferably from 1.0 to 3.0, and most preferably from 1.1 to 2.5.

In the component (A), the polymer compound (A1)' can be used alone, or in combination of two or more different units.

Further, the component (A) may also use resins conventionally used as chemically-amplified positive resist resins, such as PHS-based resins, acrylate-based resins in combination with the polymer compound (A1)', within the range that the effect of the present invention is not impaired.

In the component (A), the proportion of the polymer compound (A1)' is preferably 50% by mass or more, more preferably from 80 to 100% by mass, and most preferably 100% by mass, in terms of the effect of the present invention.

In the positive resist composition of the present invention, the content of the component (A) may be adjusted according to the thickness of the resist film to be formed.

Next, the component (A) suitably used in lithography using ArF excimer lasers will be explained below.

The component (A) suitably used for ArF excimer lasers preferably includes a polymer compound (A1)" which contains the structural units (a0) and (a1) described above; and a structural unit (a2) derived from an acrylate ester which has a lactone-containing cyclic group (hereinafter, abbreviated to structural unit (a2)); and more preferably further contains a structural unit (a3) derived from an acrylate ester which has a polar group-containing aliphatic hydrocarbon group (hereinafter, abbreviated to structural unit (a3)). The polymer compound (A1)" may also include another structural unit (a-4).

The structural units (a2), (a3) and (a-4) will be explained below.

Structural Unit (a2)

The polymer compound (A1)" preferably includes the structural unit (a2) derived from an acrylate ester which has a lactone-containing cyclic group.

Here, the term "lactone-containing cyclic group" represents a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

In the case of using the polymer compound (A1)" to form a resist film, the structural unit (a2) is effective so as to improve the adhesion between the resist film and a substrate, and to improve hydrophilicity with the developing solution.

The structural unit (a2) can be used arbitrarily without any particular restriction.

Specific examples of the lactone-containing monocyclic group include a group wherein one hydrogen atom is eliminated from γ-butyrolactone. Furthermore, specific examples of the lactone-containing polycyclic group include a group wherein one hydrogen atom is eliminated from a bicycloalkane, a tricycloalkane, or a tetracycloalkane, which contains a lactone ring.

Specific examples of the structural unit (a2) include structural units represented by the general formulae (a2-1) to (a2-5) shown below.

[Formula 11]

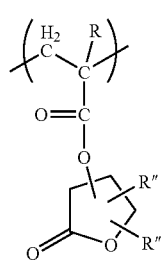
(a2-1)

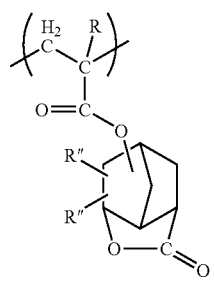
(a2-2)

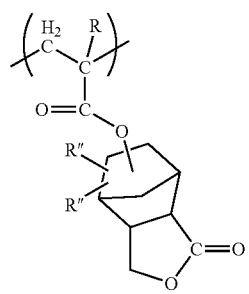
(a2-3)

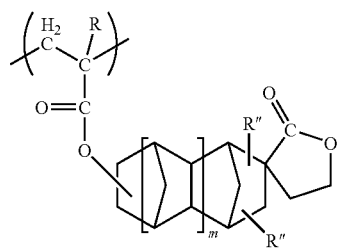
(a2-4)

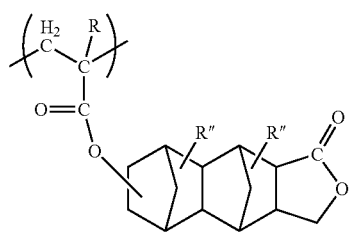
(a2-5)

(wherein, R represents a hydrogen atom, a halogen atom, a lower alkyl group, or a halogenated lower alkyl group; R" represents a hydrogen atom, a lower alkyl group, or an alkoxy group of 1 to 5 carbon atoms; and m represents an integer of 0 or 1.)

R in the general formulae (a2-1) to (a2-5) represents the same as R described above in the structural unit (a0).

The lower alkyl group of R" represents the same as the lower alkyl group of R described above in the structural unit (a0).

In the general formulae (a2-1) to (a2-5), R" is preferably a hydrogen atom in terms of industrial availability.

Specific examples of the structural units represented by general formulae (a2-1) to (a2-5) include the following.

[Formula 12]
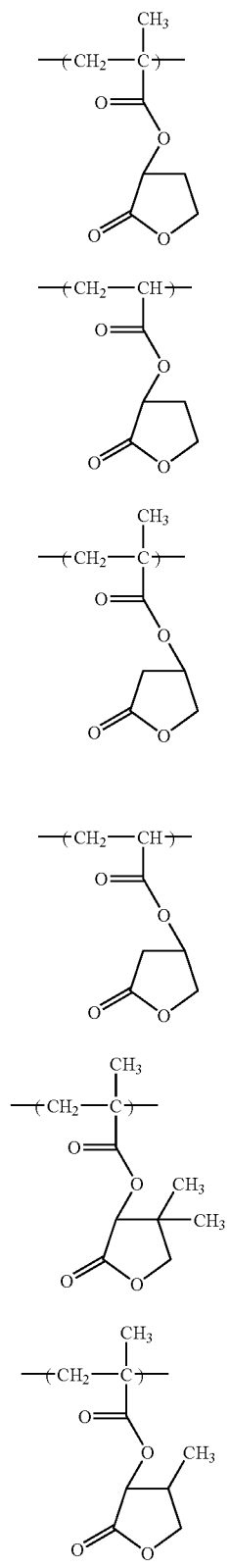
(a2-1-1)
(a2-1-2)
(a2-1-3)
(a2-1-4)
(a2-1-5)
(a2-1-6)
[Formula 13]
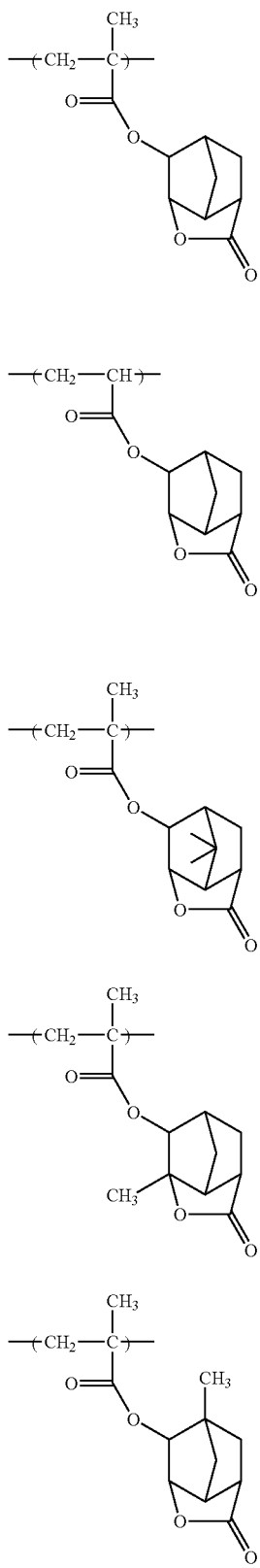
(a2-2-1)
(a2-2-2)
(a2-2-3)
(a2-2-4)
(a2-2-5)

-continued
(a2-2-6)
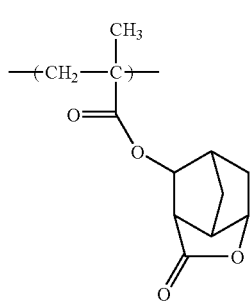
(a2-2-7)
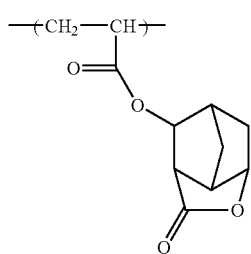
(a2-2-8)
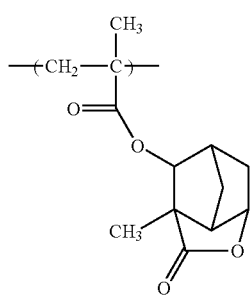
[Formula 14]
(a2-3-1)
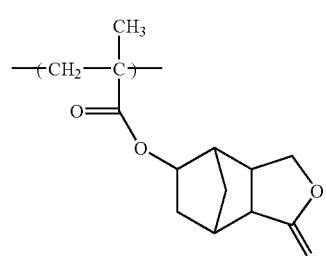
(a2-3-2)
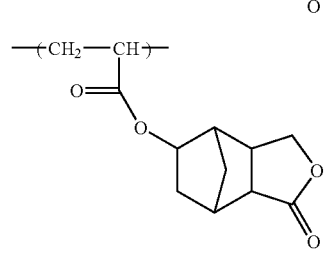
(a2-3-3)
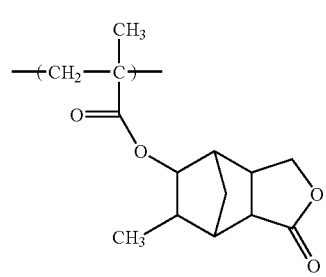
-continued
(a2-3-4)
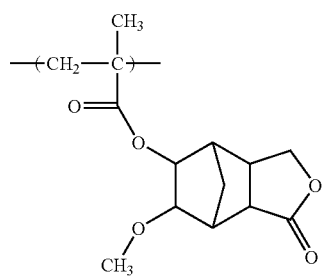
(a2-3-5)
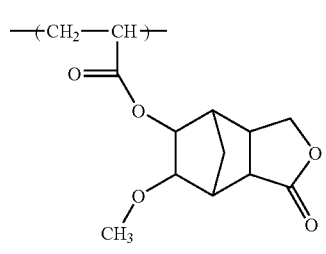
(a2-3-6)
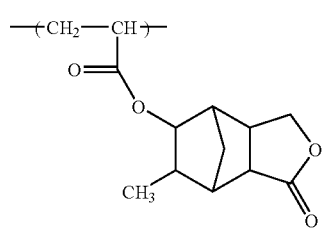
(a2-3-7)
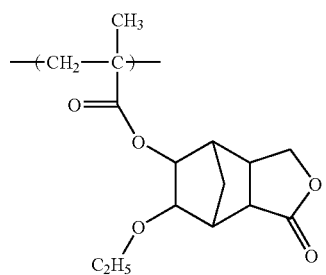
(a2-3-8)
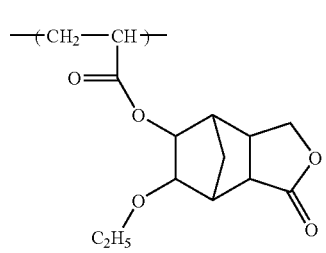
(a2-3-9)
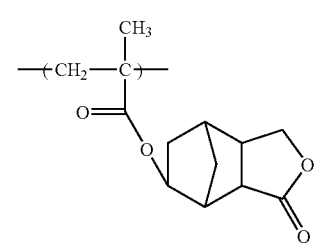

-continued
(a2-3-10)
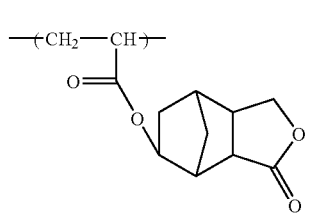
[Formula 15]
(a2-4-1)
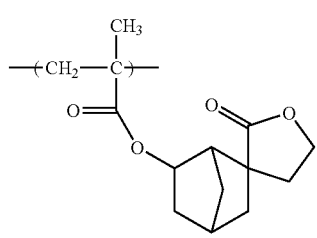
(a2-4-2)
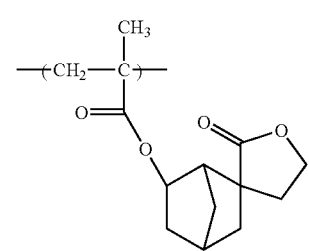
(a2-4-3)
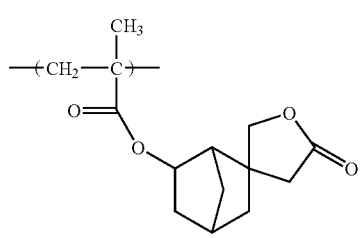
(a2-4-4)
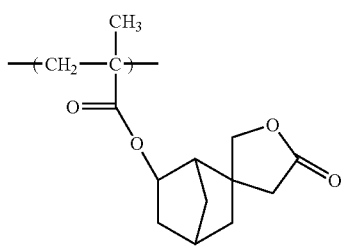
(a2-4-5)
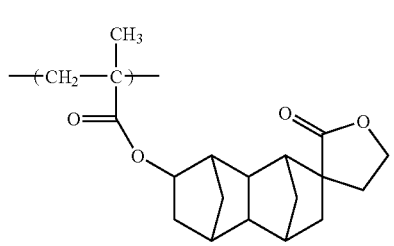
-continued
(a2-4-6)
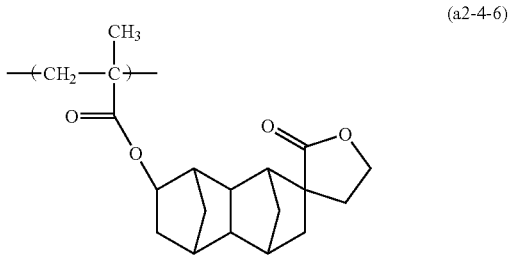
(a2-4-7)
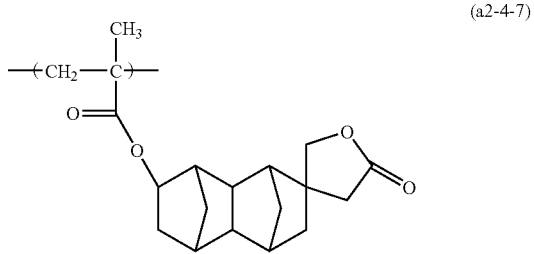
(a2-4-8)
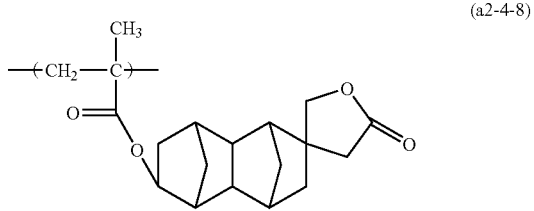
(a2-4-9)
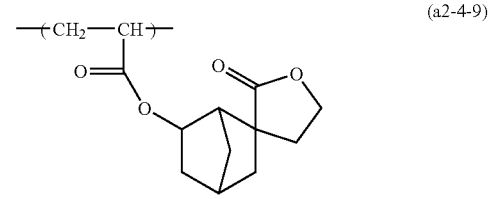
(a2-4-10)
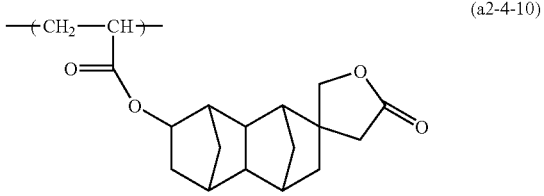
(a2-4-11)
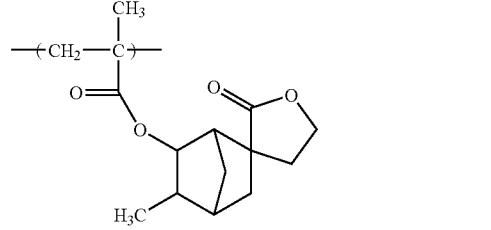
(a2-4-12)
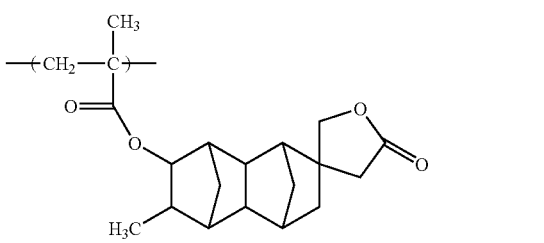

-continued

[Formula 16]

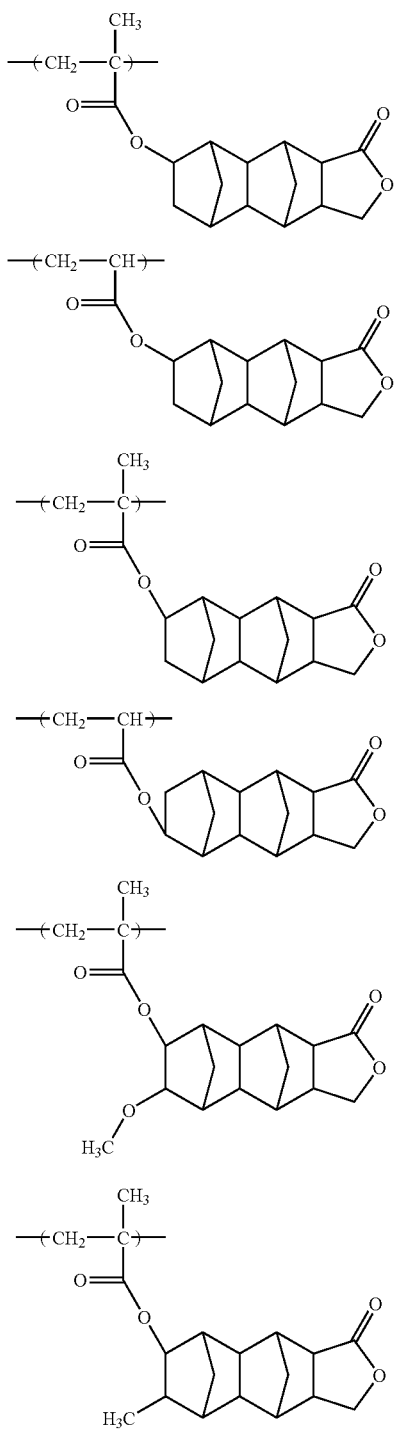

The structural unit (a2) preferably contains at least one structural unit selected from the group consisting of the structural units represented by general formulae (a2-1) to (a2-5), and more preferably at least one structural unit selected from the group consisting of the structural units represented by general formulae (a2-1) to (a2-3). Specifically, the structural unit (a2) preferably contains at least one structural unit selected from the group consisting of the structural units represented by general formulae (a2-1-1), (a2-1-2), (a2-2-1), (a2-2-2), (a2-3-1), (a2-3-2), (a2-3-9) and (a2-3-10).

In the polymer compound (A1)", the structural unit (a2) can be used alone, or in combination of two or more different units.

The proportion of the structural unit (a2) in the polymer compound (A1)" is preferably from 5 to 60 mol %, more preferably from 10 to 50 mol %, and still more preferably from 20 to 50 mol %, relative to the combined total of all the structural units that constitute the polymer compound (A1)". When this proportion is not less than the lower limit in the above range, then the effect by containing the structural unit (a2) can be sufficiently obtained. When the proportion is not more than the upper limit in the above range, good quantitative balance with the other components can be attained.

Structural Unit (a3)

It is preferable that the polymer compound (A1)" further contains a structural unit (a3) derived from an acrylate ester which has a polar group-containing aliphatic hydrocarbon group. By including the structural unit (a3), hydrophilicity of the component (A) is enhanced, thereby improving the affinity with the developing solution, and improving the alkali solubility within the exposed portions of the resist. Therefore, the structural unit (a3) contributes to an improvement in resolution.

Examples of the polar group include a hydroxyl group, a cyano group, a carboxyl group, a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of structural units proposed as resins in resist compositions for ArF excimer lasers and the like.

Of these, a structural unit derived from an acrylate ester having the polycyclic aliphatic group which contains a hydroxyl group, cyano group, a carboxyl group, or an alkyl group in which a part of the hydrogen atoms within an alkyl group has been substituted with fluorine atoms is more preferable. Examples of the polycyclic group include groups in which one or more hydrogen atoms have been removed from a bicycloalkane, tricycloalkane, tetracycloalkane, or the like. Specific examples include a group in which one or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable when the hydrocarbon group within the polar group-containing aliphatic hydrocarbon group is a linear or branched hydrocarbon group of 1 to 10 carbon atoms, and a structural unit represented by formula (a3-1), (a3-2), or (a3-3) is preferable when the hydrocarbon group is a polycyclic group.

[Formula 17]

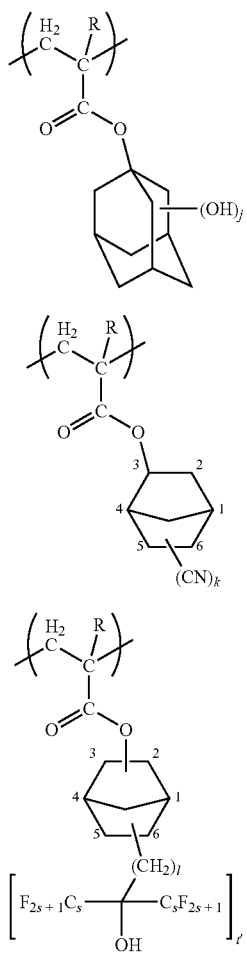

(wherein, R represents a hydrogen atom, a halogen atom, a lower alkyl group, or a halogenated alkyl group; j represents an integer from 1 to 3; k represents an integer from 1 to 3; t' represents an integer from 1 to 3; l represents an integer from 1 to 5; and s represents an integer from 1 to 3.)

In the general formula (a3-1), j is preferably 1 or 2, and more preferably 1. In the case that j is 2, a structural unit in which a hydroxyl group is bonded with the 3-position and 5-position of the adamantyl group is preferable. In the case that j is 1, a structural unit in which a hydroxyl group is bonded with the 3-position of the adamantyl group is preferable.

j is preferably 1, and a structural unit in which the hydroxyl group is bonded with the 3-position of adamantyl group is particularly preferable.

In the general formula (a3-2), k is preferably 1. In the general formula (a3-2), a structural unit in which a cyano group is bonded with the 5-position or 6-position of the norbornyl group is preferable.

In the general formula (a3-3), t' is preferably 1. 1 is preferably 1. s is preferably 1. It is preferable that a 2-norbornyl group or a 3-norbornyl group is bonded at the terminal of the carboxyl group in the acrylic acid. It is preferable that a fluorinated alkyl alcohol (hydroxyalkyl group in which a part of the hydrogen atoms in the all group is substituted with fluorine atoms) is bonded with the 5-position or 6-position of the norbornyl group.

In the polymer compound (A1)", the structural unit (a3) can be used alone, or in combination of two or more different units.

In the polymer compound (A1)", the proportion of the structural unit (a3) is preferably 5 to 50 mol %, more preferably 5 to 40 mol %, and still more preferably 5 to 25 mol %, relative to the combined total of all the structural units that constitute the polymer compound (A1)".

Structural Unit (a-4)

The polymer compound (A1)" may also include a structural unit (a-4) other than the structural units (a0), (a1), (a2) and (a3), within the range that the effect of the present invention is not impaired.

As the structural unit (a-4), any structural unit can be used without particular restrictions, as long as the structural unit is not classified as one of the above structural units (a0), (a1), (a2) and (a3), and any of the multitude of conventional structural units used within resist resins for ArF excimer lasers, electron beams (EB) or KrF excimer lasers can be used.

The structural unit (a-4) is preferably, for example, a structural unit derived from an acrylate ester containing a non-acid-dissociable aliphatic polycyclic group. Examples of the polycyclic group include groups the same as those described above in the structural unit (a1) and (a3), and any of the multitude of conventional polycyclic groups used within the resin component of resist compositions for ArF excimer lasers, electron beams (EB) or KrF excimer lasers can be used.

In particular, at least one group selected from amongst a tricyclodecanyl group, an adamantyl group, a tetracyclododecanyl group, an isobornyl group, and a norbornyl group is preferable in terms of industrial availability and the like. In these polycyclic groups, a hydrogen atom bonded with the basic ring may be substituted with a linear or branched alkyl group of 1 to 5 carbon atoms.

Specific examples of the structural unit (a-4) include a structural unit represented by general formulae (a4-1) to (a4-5) shown below.

[Formula 18]

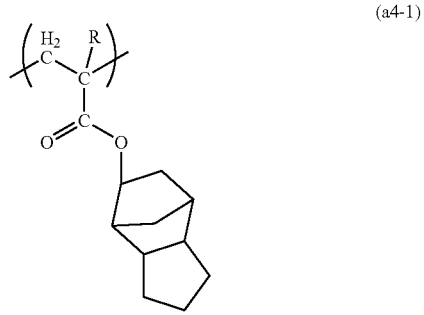

-continued

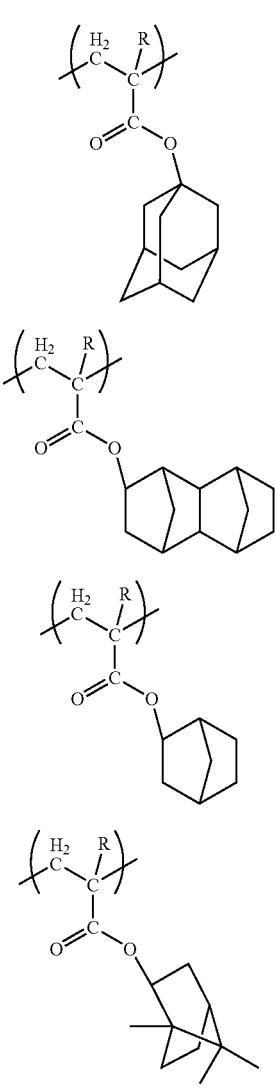

(wherein, R represents a hydrogen atom, a halogen atom, a lower alkyl group, or a halogenated lower alkyl group.)

The halogen atom, lower alkyl group, and halogenated lower alkyl group of R in the general formulae (a4-1) to (a-4-5) represent the same as the halogen atom, lower alkyl group and halogenated alkyl group which may be bonded with the α-position of the acrylate ester.

In the case that the structural unit (a-4) is included in the polymer compound (A1)", the proportion of the structural unit (a-4) is preferably 1 to 30 mol %, and more preferably 10 to 20 mol %, relative to the combined total of all the structural units that constitute the polymer compound (A1)".

In the present invention, the polymer compound (A1)" is a copolymer containing structural units (a0) and (a1), and it is preferable that the polymer compound (A1)" is a copolymer further containing a structural unit (a2) and/or (a3). The copolymer may further contain the structural unit (a-4). Examples of the copolymer include a copolymer composed of the structural units (a0), (a1), (a2) and (a3); and a copolymer composed of the structural units (a0), (a1), (a2), (a3) and (a-4).

The polymer compound (A1)" can be obtained, for example, by a conventional radical polymerization or the like of the monomers corresponding with each of the structural units, using a radical polymerization initiator such as azobisisobutyronitrile (AIBN).

Also, in the polymer compound (A1)", by simultaneously using a chain transfer agent such as HS—$CH_2$—$CH_2$—$CH_2$—$C(CF_3)_2$—OH during the above polymerization, a —$C(CF_3)_2$—OH group can be introduced at the terminals of the polymer compound (A1)". When a hydroxyalkyl group in which a part of the hydrogen atoms of the alkyl group has been substituted with fluorine atoms is introduced into a copolymer in this manner, the copolymer thus obtained can have an advantageous effect in reducing the levels of developing defects and LER (line edge roughness: non-uniform irregularities within the line side walls).

There is no particular restriction on the weight average molecular weight (Mw) (the polystyrene equivalent value determined by gel permeation chromatography (GPC), hereinafter defined as the same) of the polymer compound (A1)", and the weight average molecular weight of the polymer compound (A1)" is preferably from 2,000 to 50,000, more preferably from 3,000 to 30,000, and most preferably from 5,000 to 20,000. Ensuring that the weight average molecular weight of the polymer compound (A1)" is no more than the upper limit, solubility sufficient for a resist relative to a resist solvent can be obtained. Ensuring that it is no less than the lower limit, excellent dry-etching resistance and excellent sectional shape of the resist pattern can be obtained.

Also, the dispersion degree (Mw/Mn) of the polymer compound (A1)" is preferably from 1.0 to 5.0, more preferably from 1.0 to 3.0, and most preferably from 1.2 to 2.5. Here, Mn represents the number average molecular weight.

In the component (A), the polymer compound (A1)" can be used alone, or in combination of two or more different units.

Further, the component (A) may also use resins conventionally used as chemically-amplified positive resist resins, such as PHS-based resins, acrylate-based resins in combination with the polymer compound (A1)", within the range that the effect of the present invention is not impaired.

In the component (A), the proportion of the polymer compound (A1)" is preferable 50% by mass or more, more preferably from 80 to 100% by mass, and most preferably 100% by mass, in terms of the effect of the present invention.

In the positive resist composition of the present invention, the content of the component (A) may be adjusted according to the thickness of the resist film to be formed.

Component (B)

There is no particular restriction on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl) diazomethanes; nitrobenzyl sulfonate-based acid generators; iminosulfonate-based acid generators; and disulfone-based acid generators.

As an onium salt-based acid generator, for example, an acid generator represented by a general formula (b-0) shown below can be preferably used.

[Formula 19]

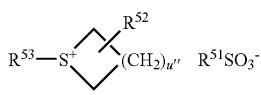
(b-0)

(wherein, $R^{51}$ represents a linear, branched or cyclic alkyl group, or a linear, branched or cyclic fluorinated alkyl group; $R^{52}$ represents a hydrogen atom, a hydroxyl group, a halogen atom, a linear, branched or cyclic alkyl group, a linear or branched halogenated alkyl group, or a linear or branched alkoxy group; $R^{53}$ represents an aryl group which may contain a substituent group; and u" represents an integer of 1 to 3.)

In the general formula (b-0), $R^{51}$ represents a linear, branched or cyclic alkyl group, or a linear, branched or cyclic fluorinated alkyl group.

The number of carbon atoms in the linear or branched alkyl group of $R^{51}$ is preferably from 1 to 10, more preferably from 1 to 8, and most preferably from 1 to 4.

The number of carbon atoms in the cyclic alkyl group of $R^{51}$ is preferably from 4 to 12, more preferably from 5 to 10, and most preferably from 6 to 10.

The number of carbon atoms in the fluorinated alkyl group is preferably from 1 to 10, more preferably from 1 to 8, and most preferably from 1 to 4. Also, the fluorination rate of the fluorinated alkyl group (proportion of substituted fluorine atoms relative to all hydrogen atoms before substitution in the alkyl group) is preferably within a range from 10 to 100%, more preferably from 50 to 100%, and particularly preferably those wherein all hydrogen atoms are substituted with fluorine atoms, because the strength of the acid increases.

$R^{51}$ is most preferably a linear alkyl group or a linear fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom of $R^{52}$ include a fluorine atom, a bromine atom, a chlorine atom and an iodine atom. Of these, a fluorine atom is preferable.

The number of carbon atoms of the linear or branched alkyl group of $R^{52}$ is preferably from 1 to 5, more preferably from 1 to 4, and most preferably from 1 to 3.

The number of carbon atoms of the cyclic alkyl group of $R^{52}$ is preferably from 4 to 12, more preferably from 4 to 10, and most preferably from 5 to 10.

The halogenated all group of $R^{52}$ is a group in which a part of or all of hydrogen atoms in the alkyl group is/are substituted with halogen atoms. The alkyl group in the halogenated alkyl group represents the same as "linear or branched alkyl group" of $R^{52}$. The halogen atoms with which the hydrogen atoms are substituted represent the same as those described above in "halogen atoms" of $R^{52}$. In the halogenated alkyl group, 50 to 100% of all the hydrogen atoms are preferably substituted with halogen atoms, and it is more preferable that all of the hydrogen atoms are substituted with halogen atoms.

The alkoxy group of $R^{52}$ is linear or branched, and the number of carbon atoms in the alkoxy group of $R^{52}$ is preferably from 1 to 5, more preferably from 1 to 4, and still more preferably from 1 to 3.

Of these, $R^{52}$ is preferably a hydrogen atom.

$R^{53}$ represents an aryl group which may have a substituent group. Examples of the basic ring from which a substituent group is removed include a naphthyl group, a phenyl group and an anthracenyl group. Of these, a phenyl group is preferable in terms of the effects of the present invention and the excellent absorption of exposure light such as ArF excimer lasers.

Examples of the substituent group include a hydroxyl group, a lower alkyl group (linear or branched lower alkyl group, preferably an alkyl group of 5 or less carbon atoms, and particularly preferably a methyl group).

The aryl group of $R^{53}$ is more preferably that which has no substituent group.

u" represents an integer of 1 to 3, preferably 2 or 3, and still more preferably 3.

Suitable examples of the acid generator represented by the general formula (b-0) include the following.

[Formula 20]

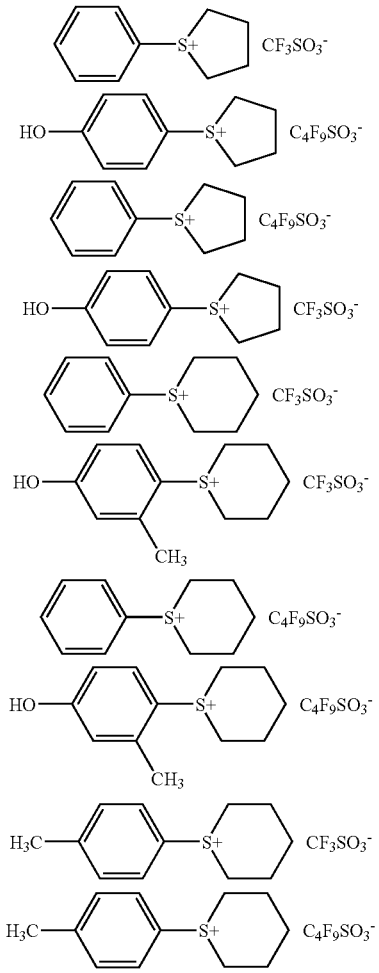

The acid generator represented by the general formula (b-0) can be used alone, or in combinations of two or more different components.

Also, as another onium salt-based acid generator which is different from the acid generator represented by the general formula (b-0), compounds represented by a general formula (b-1) or (b-2) shown below can be preferably used.

[Formula 21]

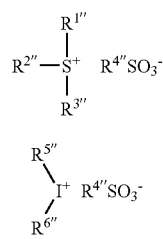

(b-1)

(b-2)

(wherein, $R^{1\prime\prime}$ to $R^{3\prime\prime}$, $R^{5\prime\prime}$ and $R^{6\prime\prime}$ each independently represents an aryl group or an alkyl group; $R^{4\prime\prime}$ represents a linear, branched or cyclic alkyl group, or a linear, branched or cyclic fluorinated alkyl group; at least one of $R^{1\prime\prime}$ to $R^{3\prime\prime}$ represents an aryl group; and at least one of $R^{5\prime\prime}$ and $R^{6\prime\prime}$ represents an aryl group.)

In the general formula (b-1), $R^{1\prime\prime}$ to $R^{3\prime\prime}$ each independently represents an aryl group or an alkyl group. At least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There is no particular restriction on the aryl group of $R^{1\prime\prime}$ to $R^{3\prime\prime}$. For example, the aryl group is an aryl group of 6 to 20 carbon atoms, and a part of or all of hydrogen atoms in the aryl group may be substituted with an alkyl group, an alkoxy group, a halogen atom and the like, or may be not substituted. The aryl group is preferably an aryl group of 6 to 10 carbon atoms because it can be synthesized inexpensively. Specific examples thereof include a phenyl group and a naphthyl group.

In the aryl group, the alkyl group in which hydrogen atoms may be substituted is preferably an alkyl group of 1 to 5 carbon atoms, and most preferably a methyl group, an ethyl group, a propyl group, an n-butyl group, and a tert-butyl group.

In the aryl group, the alkoxy group in which hydrogen atoms may be substituted is preferably an alkoxy group of 1 to 5 carbon atoms, and most preferably a methoxy group and an ethoxy group.

In the aryl group, the halogen atom in which hydrogen atoms may be substituted is preferably a fluorine atom.

There is no restriction on the alkyl groups of $R^{1\prime\prime}$ to $R^{3\prime\prime}$. Examples thereof include a linear, branched or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

Of these, it is most preferable that $R^{1\prime\prime}$ to $R^{3\prime\prime}$ each independently represents a phenyl group or a naphthyl group.

$R^{4\prime\prime}$ represents a linear, branched or cyclic alkyl group, or a linear, branched or cyclic fluorinated alkyl group.

The number of carbon atoms in the linear or branched alkyl group of $R^{4\prime\prime}$ is preferably from 1 to 10, more preferably from 1 to 8, and most preferably from 1 to 4.

The cyclic alkyl group of $R^{4\prime\prime}$ represents the same as the cyclic group described above in $R^{1\prime\prime}$. The number of carbon atoms in the cyclic alkyl group of $R^{4\prime\prime}$ is preferably from 4 to 15, more preferably from 4 to 10, and most preferably from 6 to 10.

The number of carbon atoms in the fluorinated alkyl group is preferably from 1 to 10, more preferably from 1 to 8, and most preferably from 1 to 4. Furthermore, the fluorination rate of the fluorinated alkyl group (proportion of fluorine atoms in the alkyl group) is preferably within a range from 10 to 100%, more preferably from 50 to 100%, and particularly preferably those wherein all hydrogen atoms are substituted with fluorine atoms, because the strength of the acid increases.

$R^{4\prime\prime}$ is most preferably a linear or cyclic alkyl group, or a linear or cyclic fluorinated alkyl group.

In the general formula (b-2), $R^{5\prime\prime}$ and $R^{6\prime\prime}$ each independently represents an aryl group or an alkyl group. At least one of $R^{5\prime\prime}$ and $R^{6\prime\prime}$ represents an aryl group. Both of $R^{5\prime\prime}$ and $R^{6\prime\prime}$ preferably represent aryl groups.

The aryl groups of $R^{5\prime\prime}$ and $R^{6\prime\prime}$ represent the same as those described above in "aryl group" of $R^{1\prime\prime}$ to $R^{3\prime\prime}$.

The alkyl groups of $R^{5\prime\prime}$ and $R^{6\prime\prime}$ represent the same as those described in "alkyl group" of $R^{1\prime\prime}$ to $R^{3\prime\prime}$.

Of these, it is most preferable that both of $R^{5\prime\prime}$ and $R^{6\prime\prime}$ are phenyl groups.

$R^{4\prime\prime}$ in the general formula (b-2) represents the same as those described in $R^{4\prime\prime}$ in the general formula (b-1) shown above.

Specific examples of an onium salt-based acid generator represented by the general formulae (b-1) and (b-2) include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate of triphenylsulfonium, heptafluoropropanesulfonate or nonafluorobutanesulfonate thereof, trifluoromethanesulfonate of tri(4-methylphenyl)sulfonium, heptafluoropropanesulfonate or nonafluorobutanesulfonate thereof, trifluoromethanesulfonate of dimethyl(4-hydroxynaphthyl)sulfonium, heptafluoropropanesulfonate or nonafluorobutanesulfonate thereof, trifluoromethanesulfonate of monophenyldimethylsulfonium, heptafluoropropanesulfonate or nonafluorobutanesulfonate thereof, trifluoromethanesulfonate of diphenylmonomethylsulfonium, heptafluoropropanesulfonate or nonafluorobutanesulfonate thereof, trifluoromethanesulfonate of (4-methylphenyl)diphenylsulfonium, heptafluoropropanesulfonate or nonafluorobutanesulfonate thereof, trifluoromethanesulfonate of (4-methoxyphenyl)diphenylsulfonium, heptafluoropropanesulfonate or nonafluorobutanesulfonate thereof, trifluoromethanesulfonate of tri(4-tert-butyl)phenylsulfonium, heptafluoropropanesulfonate or nonafluorobutanesulfonate thereof, trifluoromethansulfonate of diphenyl(1-(4-methoxy)naphthyl)sulfonium, heptafluoropropanesulfonate or nonafluorobutanesulfonate thereof, trifluoromethanesulfonate of di(1-naphthyl)phenylsulfonium, heptafluoropropanesulfonate or nonafluorobutanesulfonate thereof. Also, onium salts in which anionic sites of these onium salts are substituted with methanesulfonate, n-propanesulfonate, n-butanesulfonate, or n-octanesulfonate can be used.

Further, an onium salt-based acid generator in which the anionic site in the general formula (b-1) or (b-2) is substituted with an anionic site represented by a general formula (b-3) or (b-4) shown below can also be used. Here, the cationic site is the same as those described in the general formula (b-1) or (b-2).

[Formula 22]

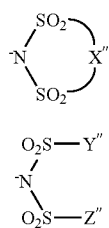

(b-3)

(b-4)

(wherein, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group of X" is from 2 to 6, preferably from 3 to 5, and most preferably 3.

Y" and Z" each independently represents a linear or branched alkyl group in which at least one hydrogen atom is substituted with a fluorine atom. The number of carbon atoms in the alkyl group of Y" and Z" is from 1 to 10, preferably from 1 to 7, and more preferably from 1 to 3.

Lower numbers of carbon atoms within the alkylene group X" or the allyl groups Y" and Z" result in better solubility within the resist solvent, and are consequently preferred.

Furthermore, in the alkylene group X" or the alkyl groups Y" and Z", higher numbers of hydrogen atoms that have been substituted with fluorine atoms result in increasing the strength of an acid and also improving the transparency relative to high energy light beams of 200 nm or less, or electron beams, and are consequently preferred. The proportion of fluorine atoms in the alkylene group or alkyl group, that is, the fluorination rate, is preferably within a range from 70 to 100%, more preferably from 90 to 100%. A perfluoroalkylene group or a perfluoroalkyl group wherein all hydrogen atoms are substituted with fluorine atoms is most preferable.

In the present specification, the term "oxime sulfonate-based acid generator" represents a compound which has at least one of the groups represented by a general formula (B-1) shown below, and has a property to generate an acid upon exposure to radiation. These kinds of oxime sulfonate-based acid generators are widely used for a chemically-amplified resist composition, so any oxime sulfonate-based acid generator can be used arbitrarily selected from these.

[Formula 23]

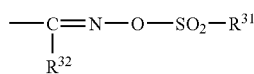

(B-1)

(in the general formula (B-1), $R^{31}$ and $R^{32}$ each independently represents an organic group.)

The organic groups of $R^{31}$ and $R^{32}$ are groups containing carbon atoms, and may further contain atoms other than carbon atoms (for example, a hydrogen atom, an oxygen atom, a nitrogen atom, a sulfur atom and a halogen atom (a fluorine atom, a chlorine atom and the like)).

The organic group of $R^{31}$ preferably a linear, branched or cyclic alkyl group or an aryl group. The alkyl group or aryl group may contain a substituent group. There is no particular restriction on the substituent group, and examples thereof include a fluorine atom, a linear, branched or cyclic alkyl group of 1 to 6 carbon atoms. Here, the term "containing a substituent group" represents that a part of or all of hydrogen atoms of the alkyl group or aryl group is/are substituted with substituent groups.

The number of carbon atoms in the alkyl group of $R^{31}$ is preferably from 1 to 20, more preferably from 1 to 10, still more preferably from 1 to 8, still more preferably from 1 to 6, and most preferably from 1 to 4. The alkyl group of $R^{31}$ is particularly preferably an alkyl group which is partially or completely halogenated (hereinafter, sometimes referred to as a halogenated alkyl group). Here, a partially halogenated alkyl group represents an alkyl group in which a part of the hydrogen atoms is substituted with halogen atoms, and a completely halogenated alkyl group represents an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, a halogenated alkyl group is preferably a fluorinated alkyl group.

The number of carbon atoms in the aryl group of $R^{31}$ is preferably from 4 to 20, more preferably from 4 to 10, and most preferably from 6 to 10. The aryl group is particularly preferably an aryl group which is partially or completely halogenated. Here, a partially halogenated aryl group represents an aryl group in which a part of the hydrogen atoms is substituted with halogen atoms, and a completely halogenated aryl group represents an aryl group in which all of the hydrogen atoms are substituted with halogen atoms.

$R^{31}$ is particularly preferably an alkyl group of 1 to 4 carbon atoms containing no substituent group, or a fluorinated alkyl group of 1 to 4 carbon atoms.

The organic group of $R^{32}$ is preferably a linear, branched or cyclic alkyl group, an aryl group or a cyano group. The alkyl group or aryl group of $R^{32}$ represents the same as those described above in the alkyl group or aryl group of $R^{31}$.

$R^{32}$ is particularly preferably a cyano group, an alkyl group of 1 to 8 carbon atoms containing no substituent group, or a fluorinated alkyl group of 1 to 8 carbon atoms.

The oxime sulfonate-based acid generator is more preferably a compound represented by a general formula (B-2) or (B-3) shown below.

[Formula 24]

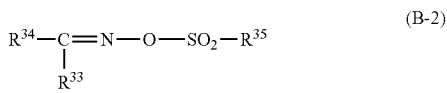

(B-2)

(in the general formula (B-2), $R^{33}$ represents a cyano group, an alkyl group containing no substituent group, or a halogenated alkyl group; and $R^{34}$ represents an aryl group; and $R^{35}$ represents an alkyl group containing no substituent group or a halogenated alkyl group.)

[Formula 25]

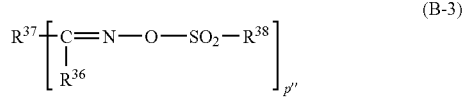

(in the general formula (B-3), $R^{36}$ represents a cyano group, an alkyl group containing no substituent group, or a halogenated alkyl group; $R^{37}$ represents a bivalent or trivalent aromatic hydrocarbon atom; $R^{38}$ represents an alkyl group containing no substituent group or a halogenated alkyl group; and p″ represents an integer of 2 or 3.)

In the general formula (B-2), the number of carbon atoms in the alkyl group containing no substituent group or the halogenated alkyl group of $R^{33}$ is preferably from 1 to 10, more preferably from 1 to 8, and most preferably from 1 to 6.

$R^{33}$ is preferably a halogenated alkyl group, and more preferably a fluorinated alkyl group.

The fluorinated alkyl group of $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group of $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group; and heteroaryl groups in which a part of the carbon atoms which constitute the ring(s) of these groups is substituted with heteroatoms such as an oxygen atom, a sulfur atom, and a nitrogen atom. Of these, a fluorenyl group is preferable.

The aryl group of $R^{34}$ may contain a substituent group such as an alkyl group, a halogenated alkyl group and an alkoxy group of 1 to 10 carbon atoms. The number of alkyl groups or halogenated alkyl groups in the substituent group is preferably from 1 to 8, and more preferably from 1 to 4. Also, the halogenated alkyl group is preferably a fluorinated alkyl group.

The number of carbon atoms in the alkyl group containing no substituent group or the halogenated alkyl group of $R^{35}$ is preferably from 1 to 10, more preferably from 1 to 8, and most preferably from 1 to 6.

$R^{35}$ is preferably a halogenated alkyl group, and more preferably a partially or completely fluorinated alkyl group.

The fluorinated alkyl group of $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group of $R^{35}$ is most preferably a completely fluorinated alkyl group in which 100% of the hydrogen atoms are substituted with fluorine atoms.

In the general formula (B-3), the alkyl group containing no substituent group or the halogenated alkyl group of $R^{36}$ represents the same as those described above in the alkyl group containing no substituent group or the halogenated alkyl group of $R^{33}$.

Examples of the bivalent or trivalent aromatic hydrocarbon group of $R^{37}$ include aryl groups of $R^{34}$ in which one or two hydrogen atoms are further removed.

The alkyl group containing no substituent group or the halogenated alkyl group of $R^{38}$ represents the same as those described above in the alkyl group containing no substituent group or the halogenated alkyl group of $R^{35}$.

p″ is preferably 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242A2 (Examples 1 to 40 on pages 65 to 85) can be preferably used.

Further, suitable examples thereof include the following.

[Formula 26]

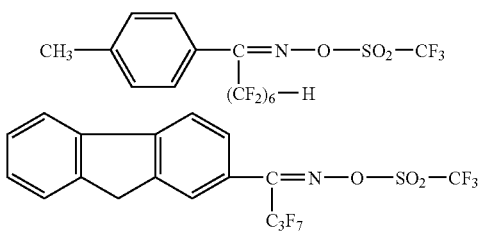

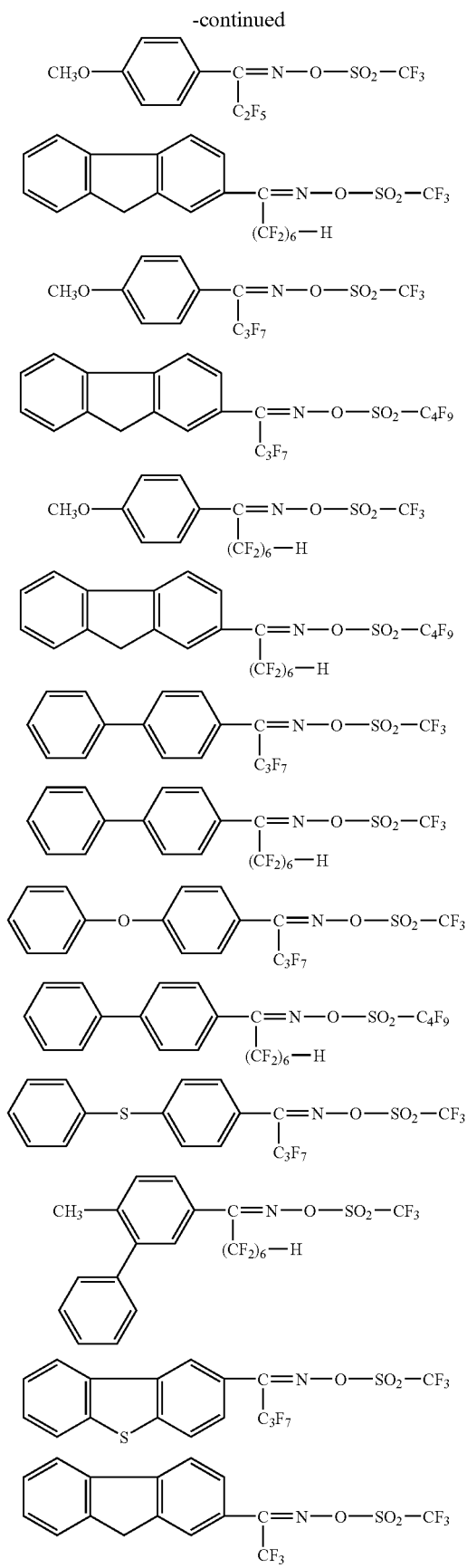

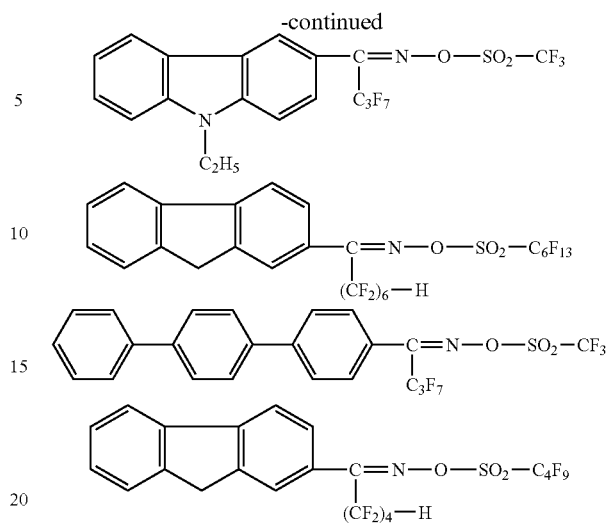

Of these compounds, the four compounds shown below are preferable.

[Formula 27]

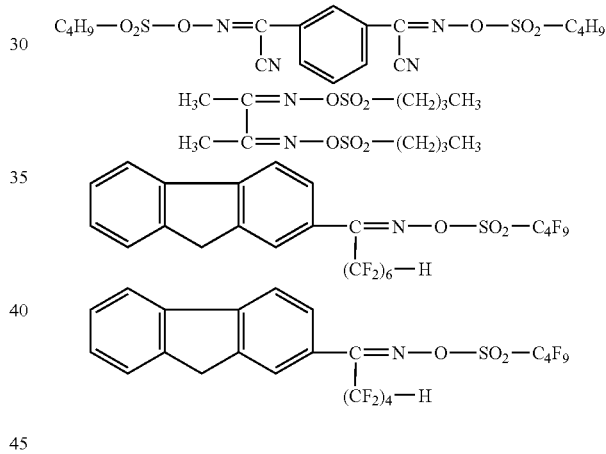

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

Of these, as the component (B) in the present invention, onium salts with a fluorinated alkylsulfonate ion as the anion are preferably used. Specifically, triphenylsulfonium nonafluorobutanesulfonate and the like are preferable.

The amount of the component (B) in the positive resist composition of the present invention is preferably within a range from 0.5 to 30 parts by mass, and more preferably from 1 to 15 parts by mass, based on 100 parts by mass of the component (A). When the amount is within the range, a pattern can be sufficiently formed. Further, when the amount is within the range, a uniform solution can be obtained, storage stability becomes excellent, and consequently it is preferable.

Component (D)

In the positive resist composition of the present invention, in order to improve the resist pattern shape and the post exposure stability of the latent image formed by the pattern-wise exposure of the resist layer, a nitrogen-containing organic compound (D) hereinafter, referred to as component (D)) is preferably included in the resist composition as an optional component.

Since a multitude of these components (D) have already been proposed, any of these known compounds can be arbitrarily used. Of these, an aliphatic amine, particularly a secondary aliphatic amine or tertiary aliphatic amine is preferred. Here, the term "aliphatic" is a relative concept used in relation to the term "aromatic", and defines a group or compound or the like that contains no aromaticity.

The term "aliphatic cyclic group (alicyclic group)" represents a monocyclic or polycyclic group that contains no aromaticity.

Examples of the aliphatic amine include an amine (alkylamine or alkyl alcoholamine) wherein at least one of the hydrogen atoms of $NH_3$ is substituted with an alkyl or hydroxyalkyl group having 12 or less carbon atoms.

Specific examples thereof include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, or tri-n-octanolamine. Among these amines, trialkylamines of 5 to 10 carbon atoms are preferable, and tri-n-octylamine is most preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These may be used either alone, or in combination of two or more different compounds.

The component (D) is typically used in a quantity within a range from 0.01 to 5.0 parts by weight, based on 100 parts by weight of the component (A).

Optional Components

In the positive resist composition of the present invention, in order to prevent any deterioration in sensitivity, and improve the resist pattern shape and the post exposure stability of the latent image formed by the pattern-wise exposure of the resist layer, an organic carboxylic acid, or a phosphorus oxo acid or derivative thereof (E) (hereinafter, referred to as component (E)) can be also added as an optional component.

Suitable examples of organic carboxylic acids include malonic acid, citric acid, malic acid, succinic acid, benzoic acid, and salicylic acid.

Suitable examples of phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is used in a quantity within a range from 0.01 to 5.0 parts by weight, based on 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

The positive resist composition of the present invention can be prepared by dissolving materials in an organic solvent (hereinafter, sometimes referred to as component (S)).

The component (S) may be an organic solvent which can dissolve the respective components used in the present invention to give a uniform solution, and one or more kinds of organic solvents can be used, appropriately selecting from those which have been conventionally known as a solvent for a chemically-amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols and derivatives thereof such as ethylene glycol, diethylene glycol, propylene glycol, dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether and monobutyl ether) and monophenyl ether of the above polyhydric alcohols or the above compounds having ester bonds; cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, amylbenzene, isopropylbenzene, toluene, xylene, cymene, and mesitylene.

These organic solvents may be used either alone, or as a mixed solvent of two or more different solvents.

Of these, propylene glycol monomethyl ether acetate (PGMEA), propylene glycol monomethyl ether (PGME) and EL are preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within a range from 1:9 to 9:1, and more preferably from 2:8 to 8:2.

More specifically, in the case of using EL as the polar solvent, the mass ratio PGMEA:EL is preferably from 1:9 to 9:1, and more preferably from 2:8 to 8:2. Furthermore, in those case of using PGME as the polar solvent, the mass ratio PGMEA:PGME is preferably from 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within a range from 70:30 to 95:5.

There is no particular restriction on the quantity of the component (S), and the quantity should be set in accordance with the required coating film thickness within a concentration that enables favorable application of the solution to a substrate or the like. Typically, the quantity is set so that the solid fraction concentration within the resist composition falls within a range from 2 to 20% by weight, and still more preferably from 5 to 15% by weight.

In the relations between the exposure amount and film thickness of the resist film (resist film thickness), the positive resist composition of the present invention has an effect that the range of exposure amount between the exposure amount in which the resist film thickness becomes 0 and the exposure amount in which a so-called "negative conversion" starts to be caused can be wide. That is, the positive composition of the present invention has an effect that an excellent negative conversion margin can be obtained. Although the reason is not clear, it can be speculated as follows.

In the present invention, the polymer compound (A1) contains a structural unit (a0) having a carboxyl group. By the action of the carboxyl group, a phenomenon that the exposed portion of the component (A) can display a higher dissolution rate relative to a developing solution is observed. From the above observation, it is expected that, by containing the structural unit (a0), the exposed portion of the component (A) has higher hydrophilicity relative to the developing solution.

Further, the polymer compound (A1) includes a structural unit (a1) containing a so-called acetal type acid dissociable, dissolution inhibiting group. The acid dissociable, dissolution inhibiting group can be dissociated by low activation energy, therefore the acid dissociable, dissolution inhibiting group in the exposed portion of the component (A) is dissociated in higher proportion and, as in the case of the structural unit (a0), higher hydrophilicity relative to the developing solution can be obtained.

For these reasons, it is considered that, in the component (A) including the polymer compound (A1) which contains the structural units (a0) and (a1), negative conversion is suppressed by improving the solubility of the exposed portion of the component (A) relative to the developing solution. Also, it is speculated that, even if negative conversion just starts to be caused in a part of the component (A), the part of the component (A) increases the hydrophilicity relative to the developing solution by the action of the structural units (a0) and (a1), thereby being dissolved in the developing solution, and consequently negative conversion can be suppressed. Also, since the polymer compound (A1)' contains the structural units (a0) and (a1), the component (A) which includes the polymer compound (A1)' can obtain the same effect as the component (A) which includes the polymer compound (A1). Moreover, since the polymer compound (A1)" contains the structural units (a0) and (a1), the component (A) which includes the polymer compound (A1)" can obtain the same effect as the component (A) which includes the polymer compound (A1).

For these reasons, it is speculated that the positive resist composition of the present invention can obtain an excellent negative conversion margin.

<<Resist Pattern-Forming Method>>

A method of forming a resist pattern of the present invention includes the steps of forming a resist film on a substrate using the positive resist composition described above, exposing the resist film, and developing the resist film to form a resist pattern.

More specifically, a method of forming a resist pattern of the present invention, for example, can be conducted in the following manner.

Namely, the positive resist composition described above is first applied to a substrate using a spinner or the like, prebaking (PAB) is then conducted under temperature conditions of 80 to 150° C. for 40 to 120 seconds, preferably for 60 to 90 seconds, followed by selective exposure of the thus obtained film by irradiating an electron beam (EB) or ArF excimer laser light using an ArF exposure apparatus or the like through a desired mask pattern, and then post exposure baking (PEB) is conducted under temperature conditions of 80 to 150° C. for 40 to 120 seconds, preferably for 60 to 90 seconds. Subsequently, a developing treatment is conducted using an alkali developing solution such as a 0.1 to 10% by mass aqueous solution of tetramethylammonium hydroxide. In this manner, a resist pattern that is faithful to the mask pattern can be obtained.

Here, an organic or inorganic anti-reflective film may also be provided between the substrate and the applied layer of the resist composition.

There is no particular restriction on the wavelength used for the exposure, and the exposure can be conducted using radiation such as an ArF excimer laser, a KrF excimer laser, an $F_2$ excimer laser, a vacuum ultraviolet (VUV), an extreme ultraviolet (EUV), an electron beam (EB), an X-ray radiation, or a soft X-ray radiation. The positive resist composition of the present invention is particularly effective to an ArF excimer laser, a KrF excimer laser, and an electron beam (EB).

EXAMPLES

Next, the present invention will now be described in more detail with reference to examples, but the scope of the present invention is not limited to the following examples.

Example 1 and Comparative Example 1

The components shown in Table 1 are mixed and dissolved, thereby providing a positive resist composition solution.

TABLE 1

|  | (A) | (B) | (D) | (E) | (O) | (S) |
| --- | --- | --- | --- | --- | --- | --- |
| Example 1 | (A)-1 [100] | (B)-1 [10] | (D)-1 [0.75] | (E)-1 [0.29] | (O)-1 [0.5] | (S)-1 [1900] |

TABLE 1-continued

|  | (A) | (B) | (D) | (E) | (O) | (S) |
|---|---|---|---|---|---|---|
| Comparative Example 1 | (A)-2 [100] | (B)-1 [10] | (D)-1 [0.75] | (E)-1 [0.29] | (O)-1 [0.5] | (S)-1 [1900] |

In Table 1, the abbreviations represent the following meanings. Also, the values within the brackets [represent the blending amount (parts by weight).

(A)-1: a copolymer represented by a general formula (A)-1 shown below (a resin synthesized by a conventional radical polymerization). In the copolymer, the composition ratio (molar ratio) of structural units, the weight average molecular weight (Mw), and the dispersion degree (Mw/Mn) are as follows.

a:b:c:d=65:10:22.5:2.5, Mw=7,300, and Mw/Mn=2.0

[Formula 28]

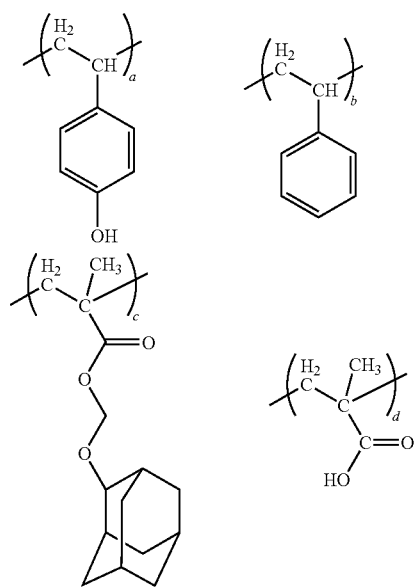

(A)-1

(A)-2: a copolymer represented by a general formula (A)-2 shown below (a resin synthesized by a conventional radical polymerization). In the copolymer, the composition ratio (molar ratio) of structural units, the weight average molecular weight (Mw), and the dispersion degree (Mw/Mn) are as follows.

a:b:c=65:10:25, Mw=8,800, and Mw/Mn=1.8

[Formula 29]

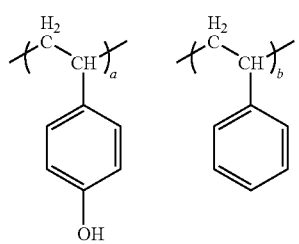

(A)-2

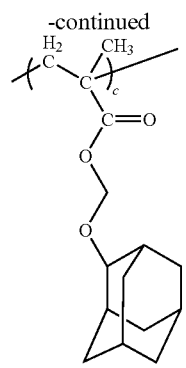

(B)-1: triphenylsulfoniumnonafluorobutane sulfonate (D)-1: tri-n-octylamine (E)-1: salicylic acid (O)-1: surfactant XR-104 (product name, manufactured by DIC Corporation)

(S)-1: PGMEA

Evaluation of Negative Conversion Margin

Using a spinner, the positive resist composition was uniformly applied onto an 8 inch silicon substrate, and was subjected to a bake treatment (post applied bake: PAB) on a hot plate at 130° C. for 90 seconds to obtain a resist film with a film thickness of 300 nm.

Subsequently, lithography in large area (0.5 cm×0.5 cm) was performed on the silicon wafer which the resist film is formed on, changing the amount of exposure within a range from 0 to 25 µC/cm$^2$ by an electron beam lithography apparatus HL-800D (manufactured by Hitachi, Ltd.; accelerating voltage of 70 kV, 7 A/cm$^2$).

Then, a post exposure bake (PEB) treatment was conducted for 90 seconds at 110° C. Furthermore, development was conducted for 60 seconds using an aqueous 2.38% by mass of tetramethylammonium hydroxide (TMAH), followed by rinsing with pure water for 30 seconds and drying, thereby forming a resist pattern.

In the exposed portions each of which was exposed by using a different amount of exposure, resist film thickness after development was measured, and the exposure amount ($E_0$, µC/cm$^2$) in which the resist film thickness became 0 and the exposure amount ($E_1$, µC/cm$^2$) in which resist film began to remain again and negative conversion started to be caused were decided, thereby evaluating the negative conversion margin. The evaluation results are shown in Table 2.

TABLE 2

|  | PAB (° C.) | PEB (° C.) | $E_0$ (µC/cm$^2$) | $E_1$ (µC/cm$^2$) |
|---|---|---|---|---|
| Example 1 | 130 | 110 | 7 | 16 |
| Comparative Example 1 | 130 | 110 | 7 | 14 |

From Table 2, it is confirmed that Example 1, in which the component (A) of the present invention is used, has a wider range of the exposure amount than Comparative Example 1 between the exposure amount (E0) in which the resist film thickness becomes 0 and the exposure amount (E1) in which the negative conversion starts to be caused, and thus an excellent negative conversion margin can be obtained. Here, it is confirmed that the negative conversion margin of Example 1 is increased by about 14% more than that of Comparative Example 1.

INDUSTRIAL APPLICABILITY

The present invention can provide a positive resist composition and a method of forming a resist pattern which have an excellent negative margin.

The invention claimed is:

1. A positive resist composition, which comprises a resin component (A) in which alkali solubility increases under the action of an acid, and an acid generator component (B) which generates an acid upon exposure, wherein
the resin component (A) comprises a polymer compound (A1)', wherein the polymer compound (A1)' consists of a structural unit (a0) containing a carboxyl group, at least one structural unit (a1) selected from the group consisting of a structural unit represented by a general formula (a1-2) shown below and a structural unit represented by a general formula (a1-4) shown below:

[Formula 1]

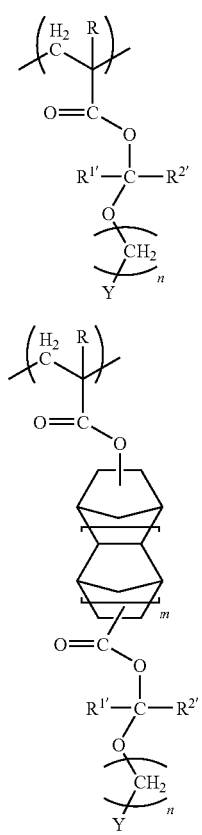

(wherein, Y represents an aliphatic cyclic group or a lower alkyl group of 1 to 5 carbon atoms; n represents 0; m represents 0 or 1; R represents a hydrogen atom, a halogen atom, a lower alkyl group of 1 to 5 carbon atoms, or a halogenated lower alkyl group of 1 to 5 carbon atoms; and $R^{1\prime}$ and $R^{2\prime}$ each independently represents a hydrogen atom or a lower alkyl group of 1 to 5 carbon atoms), a structural unit (a2)' derived from hydroxystyrene, and a structural unit (a3)' derived from styrene, wherein the structural unit (a0) comprises a structural unit represented by general formulae (a0-1) and/or (a0-2) shown below:

[Formula 2]

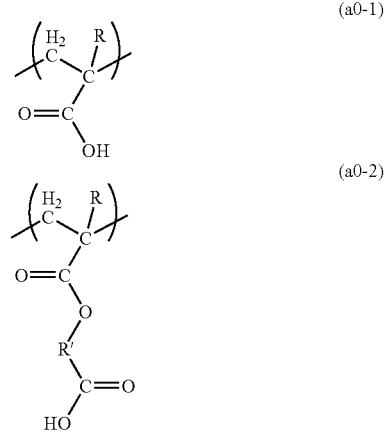

(wherein R represents a hydrogen atom, a halogen atom, a lower alkyl group of 1 to 5 carbon atoms or a halogenated lower alkyl group of 1 to 5 carbon atoms; and R' represents a chain or cyclic alkylene group).

2. The positive resist composition according to claim 1, wherein the proportion of the structural unit (a0) is 1 to 20 mol %, relative to the combined total of all the structural units that constitute the polymer compound (A1)'.

3. The positive resist composition according to claim 1, wherein the proportion of the structural unit (a1) is 5 to 50 mol %, relative to the combined total of all the structural units that constitute the polymer compound (A1)'.

4. The positive resist composition according to claim 1, further comprising a nitrogen-containing organic compound (D).

5. A method of forming a resist pattern, comprising:
forming a resist film on a substrate using the positive resist composition described in claim 1;
exposing the resist film; and
developing the resist film to form a resist pattern.

6. A method of forming a resist pattern, comprising:
forming a resist film on a substrate using the positive resist composition described in claim 4;
exposing the resist film; and
developing the resist film to form a resist pattern.

7. The positive resist composition according to claim 1, wherein the structural unit (a2)' derived from hydroxystyrene represented by a general formula (a-2)' shown below, and the structural unit (a3)' derived from styrene represented by a general formula (a-3)' shown below:

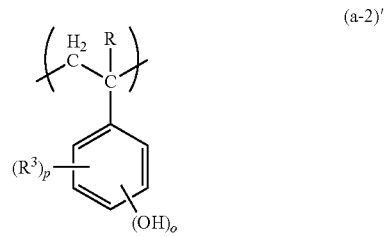

(wherein, R represents a hydrogen atom, an alkyl group, a halogen atom, or a halogenated alkyl group; $R^3$ represents a lower alkyl group of 1 to 5 carbon atoms; o represents an integer from 0 to 3; and p represents an integer from 0 to 2)

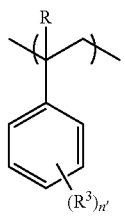

(a-3)'

(wherein, R represents a hydrogen atom, an alkyl group, a halogen atom, or a halogenated alkyl group; $R^3$ represents a lower alkyl group of 1 to 5 carbon atoms; and n' represents an integer from 0 to 3).

8. The positive resist composition according to claim 1, wherein the proportion of the structural unit (a2)' is 10 to 80 mol %, relative to the combined total of all the structural units that constitute the polymer compound (A1)'.

9. The positive resist composition according to claim 1, wherein the proportion of the structural unit (a3)' is 1 to 20 mol %, relative to the combined total of all the structural units that constitute the polymer compound (A1)'.

* * * * *

UNITED STATES PATENT AND TRADEMARK OFFICE
CERTIFICATE OF CORRECTION

PATENT NO.         : 7,871,753 B2
APPLICATION NO.    : 12/090826
DATED              : January 18, 2011
INVENTOR(S)        : Tasuku Matsumiya and Takako Hirosaki It is certified that error appears in the above-identified patent and that said Letters Patent is hereby corrected as shown below:

Col. 42, line 1, change "all" to --alkyl--.

Col. 45, line 51, change "all" to --alkyl--.

Col. 47, line 20, change "$R^{6}$" to --$R^{6"}$--.

Col. 48, lines 60-61, change "n-buthane-sulfonate," to --n-butane-sulfonate,--.

Col. 49, line 31, change "allyl" to --alkyl--.

Col. 50, line 1, change "$R^{31}$" to --$R^{31}$ is--.

Col. 55, line 26, change "hereinafter," to --(hereinafter,--.

Col. 56, line 49, change "thereof" to --thereof,--.

Col. 59, line 10, change "[represent" to --[] represent--.

Col. 62, line 26, in Claim 1, change "atoms" to --atoms,--.

Signed and Sealed this
Ninth Day of August, 2011

David J. Kappos
*Director of the United States Patent and Trademark Office*